(12) United States Patent
Wang

(10) Patent No.: US 7,786,567 B2
(45) Date of Patent: Aug. 31, 2010

(54) SUBSTRATE FOR ELECTRICAL DEVICE AND METHODS FOR MAKING THE SAME

(76) Inventor: Chung-Cheng Wang, No. 58-10, Lane 2, Joe SST. Pei-Tun Chu, Taichung (TW)

(*) Notice: Subject to any disclaimer, the term of this patent is extended or adjusted under 35 U.S.C. 154(b) by 1090 days.

(21) Appl. No.: 11/268,702

(22) Filed: Nov. 8, 2005

(65) Prior Publication Data

US 2006/0097379 A1    May 11, 2006

(30) Foreign Application Priority Data

Nov. 10, 2004  (TW) .............................. 93134190 A
Mar. 3, 2005   (TW) .............................. 94106427 A

(51) Int. Cl.
  *H01L 23/48*  (2006.01)
  *H01L 21/48*  (2006.01)
(52) U.S. Cl. ........................ 257/693; 438/117
(58) Field of Classification Search .............. 257/700, 257/686–688, 676, 693, E23.141–E23.179, 257/E23.077; 438/109–117; 174/250, 262
See application file for complete search history.

(56) References Cited

U.S. PATENT DOCUMENTS

| | | | | |
|---|---|---|---|---|
| 5,189,261 A | * | 2/1993 | Alexander et al. | 174/263 |
| 6,108,903 A | * | 8/2000 | Nakatani et al. | 29/852 |
| 7,049,528 B2 | * | 5/2006 | Kariya et al. | 174/262 |
| 2003/0011063 A1 | * | 1/2003 | Yamada | 257/698 |
| 2003/0168254 A1 | * | 9/2003 | Kariya et al. | 174/261 |

* cited by examiner

*Primary Examiner*—Calvin Lee
(74) *Attorney, Agent, or Firm*—Bacon & Thomas, PLLC

(57) ABSTRACT

Substrate for electrical devices and methods of manufacturing such substrate are disclosed. An embodiment for the substrate comprised of an insulator and a plurality of conductive elements, wherein the conductive elements embedded in the insulator, and two surfaces of the conductive element exposed to two surfaces of the insulator for electrical connection respectively, meanwhile a portion of conductive element may protrude the insulator, in this manner, solder balls are not needed, moreover the conductive element of substrate may further include either an extending portion or a protruding portion, and the present invention may be capable of affording a thinner electrical device thickness, enhanced reliability, and a decreased cost in production.

6 Claims, 17 Drawing Sheets

SUBSTRATE FOR ELECTRICAL DEVICE AND METHODS FOR MAKING THE SAME

BACKGROUND OF THE INVENTION

1. Field of the Invention

The present invention generally relates to a substrate for electrical device, and more particularly to a substrate which is enhancing the reliability of electrical device and downsizing an electrical device.

2. Description of the Related Art

Currently, both science and technology are developing rapidly, meanwhile, electrical devices are designed for thinner, wider application, lower cost, and better quality, wherein the better quality of electrical device includes higher reliability and enhanced heat dissipation, in order to achieve above objects, the manufacturers keep on developing it.

FIG. 17 shows a conventional electrical device 9 comprising a substrate 1 which including an insulator 30, a plurality of conductive elements 7,8 and a via 5, wherein said insulator 30 having a first upper surface 31 and a first lower surface 32, said first upper surface 31 of insulator 30 having an receiving area 4 which is used for accommodating a chip; said conductive element 7 is formed on said first upper surface 31 of insulator 30 and surrounding said receiving area 4, said conductive element 8 formed on said first lower surface 32 of insulator 30, said via 5 electrically connected the conductive element 7 to the conductive element 8, wherein said via 5 having a through hole 6 (i.e. the via 5 is hollow) in which an filler 43 such as solder paste, epoxy, glue or solder mask filled therein; a chip 20 mounted on the receiving area 4 of substrate 1; a conductive wire 60 electrically connected the chip 20 to the conductive element 7; an encapsulant 40 encapsulates the substrate 1, chip 20 and conductive wire 60, a solder ball 50 attached to the conductive element 8 for electrically connecting to the outside (e.g. a mother board); Accordingly, due to the solder ball 50, it is convenient for said electrical device 9 to be electrically connected to the outside, nevertheless, the cost of said electrical device 9 is increased, Moreover, the solder ball 50 is attached to the conductive element 8 by the surface 53 of the solder ball 50 exclusively, it is easy to cause peeling-off problems of said solder ball 50 by means of contamination which is happened while operating the attaching (solder ball) process, thermal effects and/or other reasons such as collision. When the peeling-off problem happened, the solder ball 50 separated from the conductive element 8 easily, it may cause the electrical device 9 not to be functional well. Furthermore, due to the via 5 is hollow, in this manner, it is easy to cause a crack problem "E" of said via 5 by means of thermal effects, when the crack "E" happened, the conductive element 7 will not be electrically connected to the conductive element 8 through said via 5 securely, then it will cause the electrical device 9 not to be functional well either; In addition, the conductive wire 60 electrically connected said chip 20 to said conductive element 7 of substrate 1 by means of a wire-bonding process, wherein said substrate 1 needs to be warm-up (i.e. heating; the temperature of heating is 140~300° C.) in order to ensure the conductive wire 60 electrically connected said chip 20 to said conductive element 7 firmly, while operating a wire-bonding process, wherein although there is a filler (e.g. solder paste) 43 filled into the through hole 6 of the via 5 for reinforcing the strength of the via 5, however said filler (solder paste) 43 will become soft during the period of heating (due to the melting temperature of solder paste is about 183° C. usually), in this manner, said conductive wire 60 does not enable to be electrically connected to said via 5 directly, but needs to be electrically connected to the conductive element 7 instead, then it is necessary for the substrate 1 to be comprised of said conductive element 7, and then cost is increased, besides, the designation of said substrate 1 is restricted too.

SUMMARY OF THE INVENTION

It is therefore an object of the invention to solve the mentioned-above problems, in accordance with the invention, the substrate includes an insulator and a plurality of conductive elements, wherein the conductive elements are embedded in the insulator, and a portion of conductive element exposed to the insulator for external connection, wherein the portion of conductive element exposed to the insulator may protrude the insulator surface for external connection, In this manner, the solder balls are not needed. Moreover, the substrate of the present invention may further comprise a submember serving as a heat spreader which is for enhancing the heat dissipation of chip, In addition, due to the conductive element of substrate is solid and hard enough, in accordance with the present invention, in this manner, the conductive wire enables to be electrically connected to the conductive element directly, then cost is saved and the restriction for designing the substrate is decreased too, moreover, the conductive element of substrate may further including either an extending portion or a protruding portion.

The aforementioned and further objects of the present invention will be more adequately appeared from the detailed description, accompanying drawings and appended claims as follow.

DETAILED DESCRIPTION OF THE INVENTION

Embodiments of the present invention will be explained with reference to the drawings as follow.

First Embodiment

Figure 1:
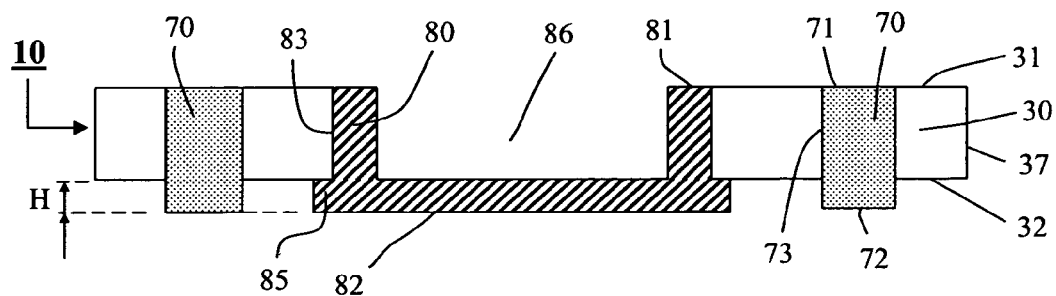
FIG. 1A shows a cross-sectional view of first embodiment of substrate in accordance with the present invention.
FIG. 1B shows a cross-sectional view of first embodiment of substrate in accordance with the present invention.
FIG. 1C shows a cross-sectional view of first embodiment of substrate in accordance with the present invention.
FIG. 1D shows a cross-sectional view of first embodiment of substrate in accordance with the present invention.
FIG. 1E shows a cross-sectional view of first embodiment of substrate in accordance with the present invention.
FIG. 1F shows a cross-sectional view of first embodiment of substrate in accordance with the present invention
FIG. 1G shows a cross-sectional view of first embodiment of substrate in accordance with the present invention.
FIG. 1H shows a cross-sectional view of first embodiment of substrate in accordance with the present invention.
FIGS. 1I~1J show cross-sectional views of first embodiment of substrate in accordance with the present invention.
FIGS. 1K~1O show cross-sectional views of second embodiment of substrate in accordance with the present invention.
FIGS. 1P~1Q show cross-sectional views of third embodiment of substrate in accordance with the present invention.
Figure 1:
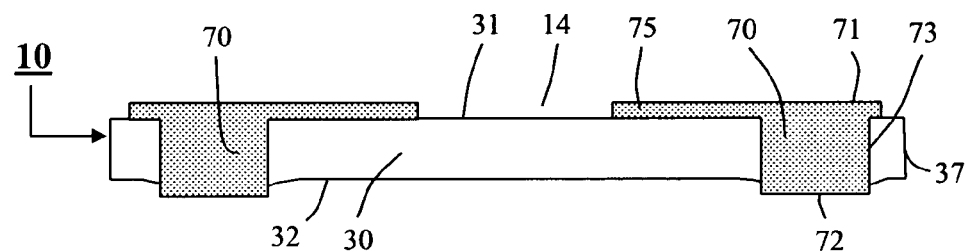
Figure 1:
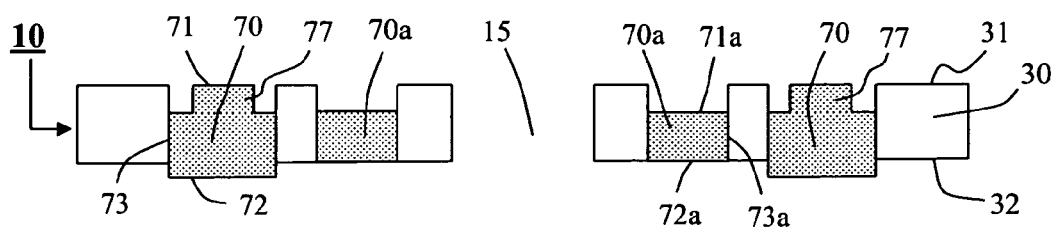
Figure 1:
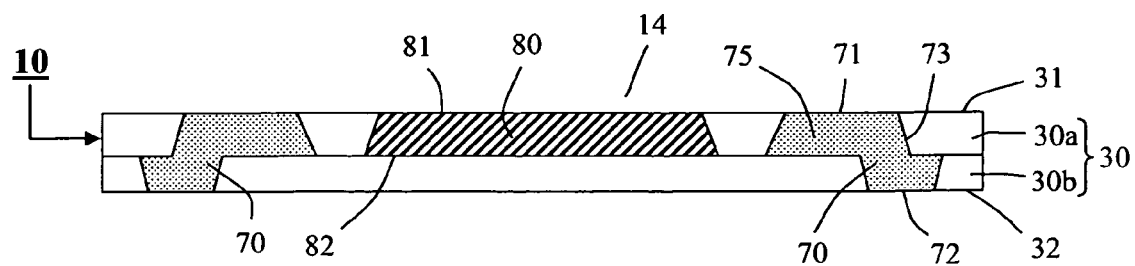
Figure 1:
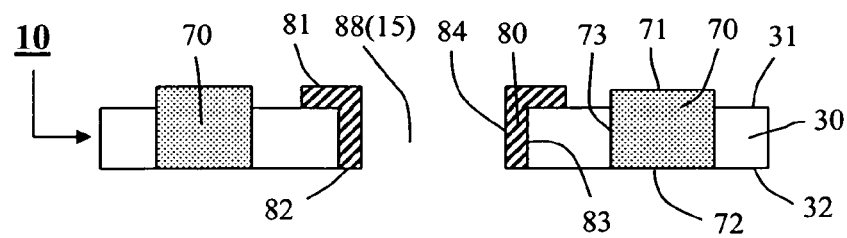
Figure 1:
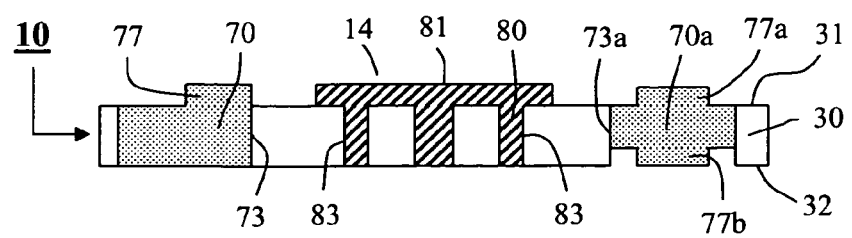
Figure 1:
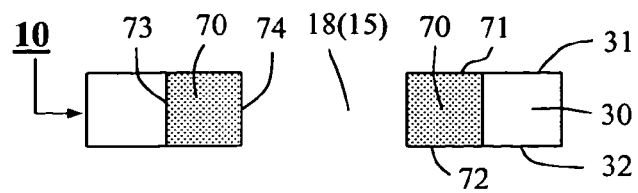
Figure 1:
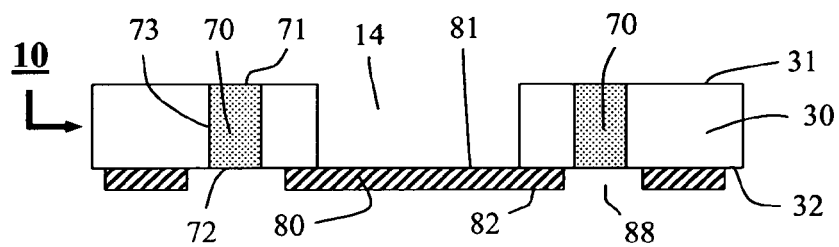
Figure 1:
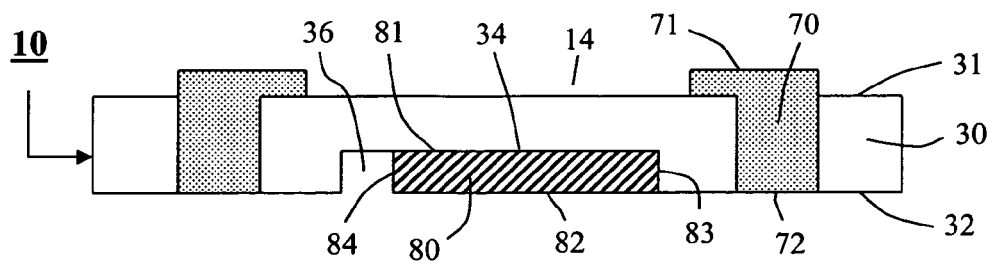
Figure 1:
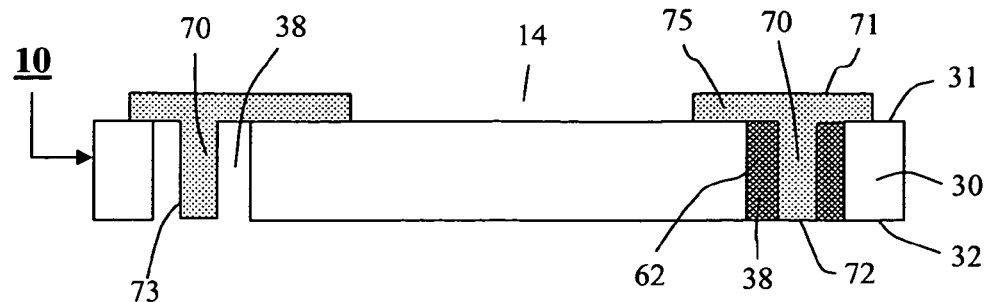
Figure 1:
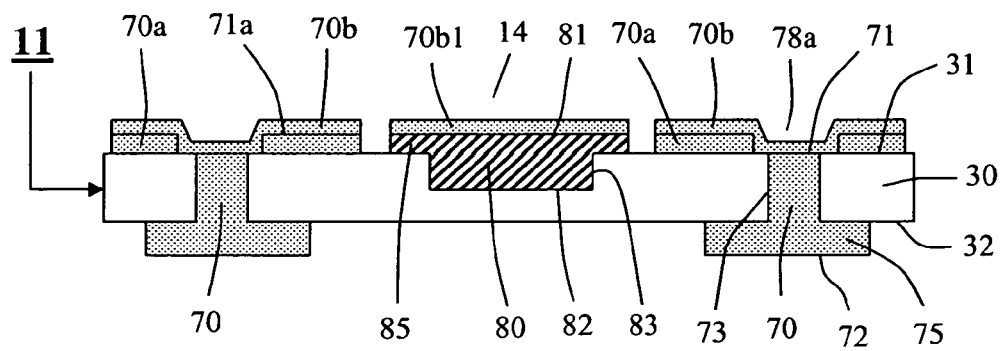
Figure 1:
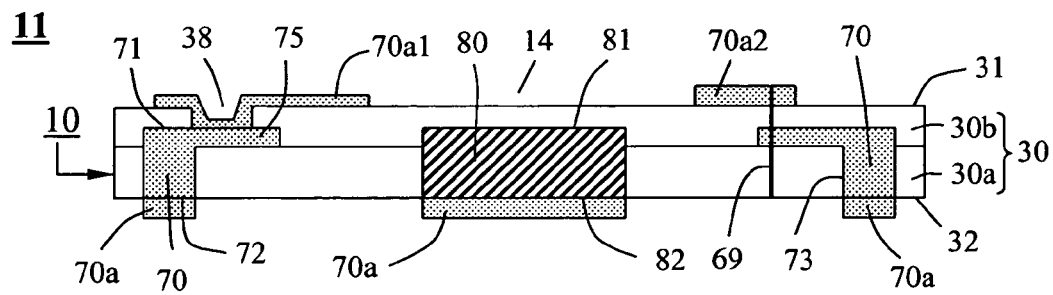
Figure 1:
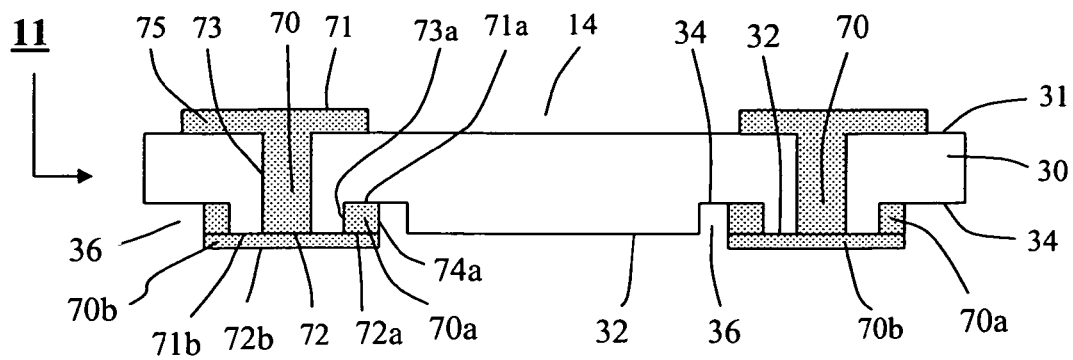
Figure 1:
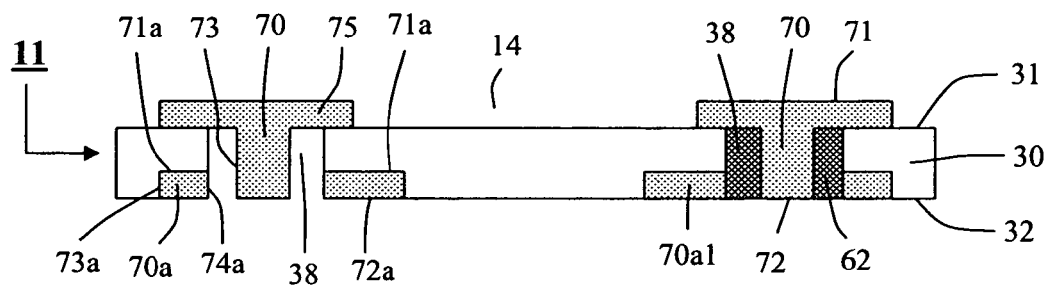
Figure 1:
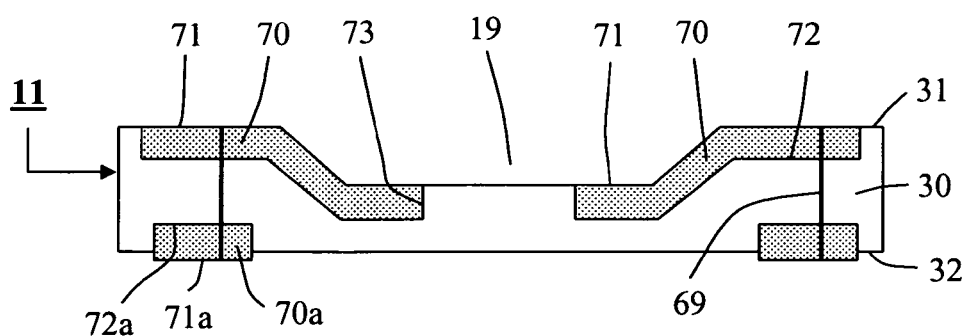
Figure 1:
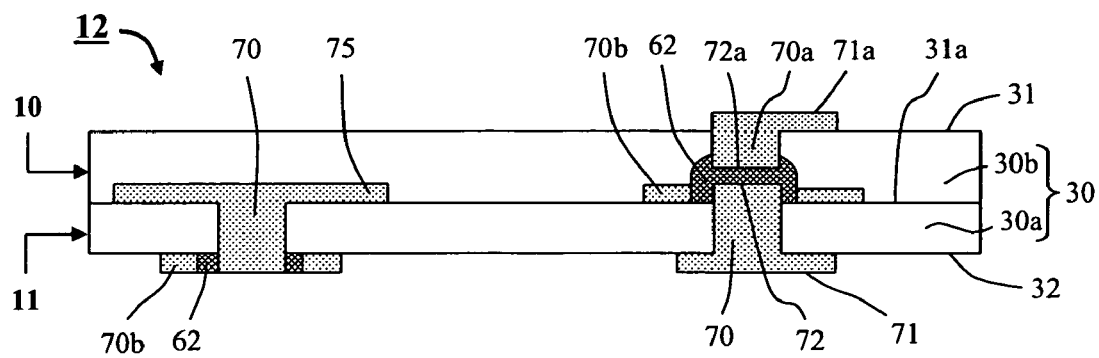
Figure 1:
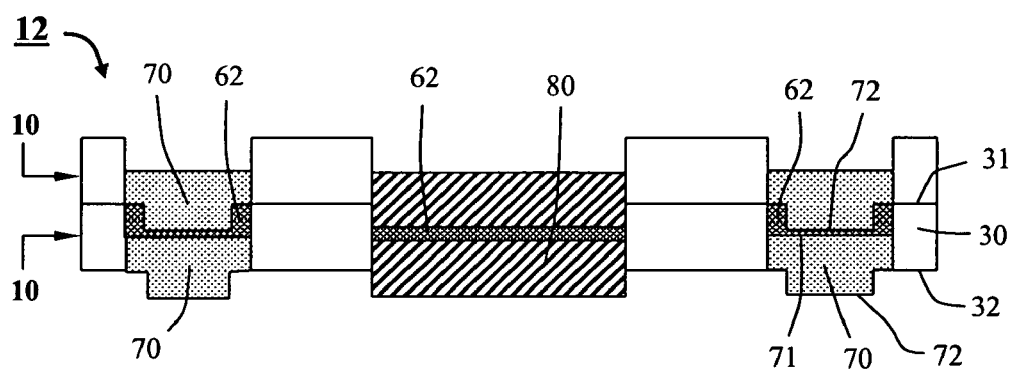
Figure 17:
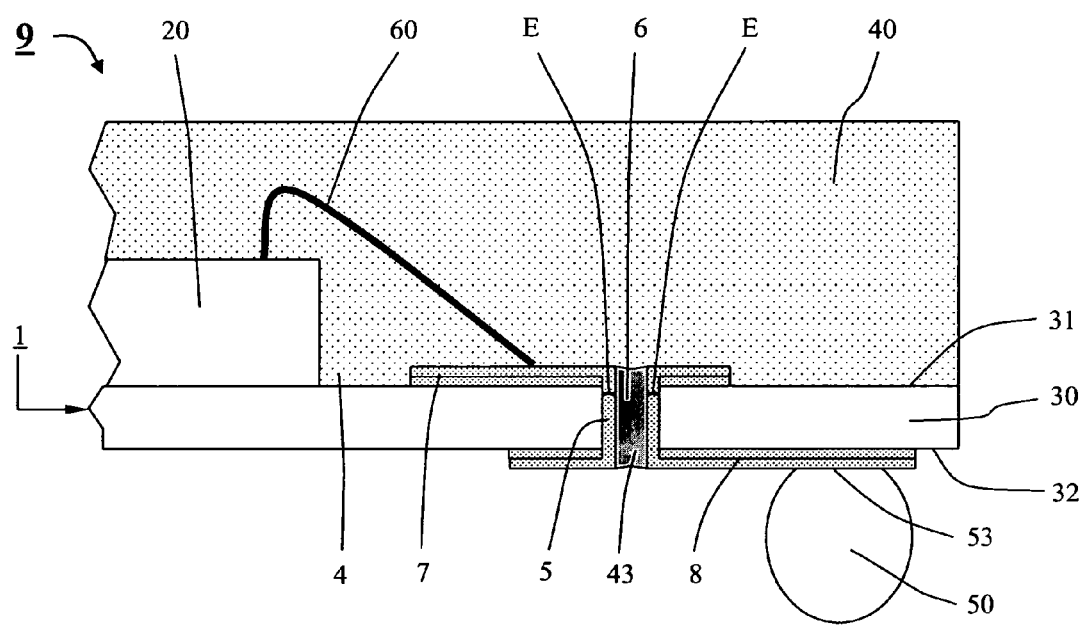
FIG. 17 shows a cross-sectional view of electrical device according to a prior art.

A first embodiment of substrate of the present invention will be explained with reference to FIG. 1A~1J, wherein said first embodiment of substrate comprised of an insulator and a plurality of first conductive elements, wherein said first conductive element may include either an extending portion (refer to FIG. 1B) or a protruding portion (refer to FIG. 1C), Moreover, the first embodiment of substrate may also include a submember as required, detailed descriptions as follow:

FIG. 1A shows a substrate 10 comprising: an insulator 30, said insulator 30 having a first upper surface 31, a first lower surface 32 and a side wall 37; a plurality of first conductive elements 70 which are made of either copper, copper alloy, nickel, aluminum, titanium or metallic alloy, said first conductive elements 70 are substantially solid; said first conductive elements 70 having a first upper surface 71, a first lower surface 72 and a first side edge 73 respectively, each said first side edge 73 of the first conductive element 70 is encapsulated by the insulator 30, in this manner, each first conductive element 70 embedded in the insulator 30, wherein the first upper surface 71 of first conductive element 70 exposed to the first upper surface 31 of insulator 30 for external connection, and the first lower surface 72 of said first conductive element 70 exposed to the first lower surface 32 of insulator 30 for external connection too, wherein the first lower surface 72 of first conductive element 70 is protruding the first lower surface 32 of insulator 30; then there is a height "H" between the first lower surface 72 of first conductive element 70 and the first lower surface 32 of insulator 30, in this manner, the first lower surface 72 of first conductive element 70 and the first lower surface 32 of insulator 30 are not in the same horizontal level; a submember 80 serving as a heat spreader which having a first upper surface 81, a first lower surface 82, a first side edge 83, an extending portion 85 and a cavity 86, wherein the cavity 86 of submember 80 is employed as the receiving area of said substrate 10 for placing chip, conductive wires, encapsulant and adhesive means such as epoxy, glue etc., wherein said extending portion 85 is for enhancing heat dissipation of chip (not shown), Furthermore, due to the first side edge 83 of submember 80 encapsulated by the insulator 30, then the submember 80 embedded in the insulator 30, and the first upper, lower surfaces 81,82 of submember 80 exposed to the first upper, lower surfaces 31, 32 of insulator 30 respectively, wherein the first lower surface 82 of submember 80 also protruding the first lower surface 32 of insulator 30, and the submember 80 may be made of the same material of the first conductive element 70 as required; in addition, the submember 80 is optional; accordingly, (i.) due to there is not any through hole in the first conductive element 70, then the problem of crack will be avoided, and the reliability of substrate 10 enhanced, and (ii.) due to the first lower surface 72 of first conductive element 70 being protruded and exposed to the first lower surface 32 of insulator 30, it is convenient for the first conductive element 70 to electrically connect to outside, then the solder ball is not needed, the cost for manufacturing the substrate 10 decreased; and (iii.) due to the first conductive element 70 is made of metallic material such as copper and is substantially solid, consequently, even though the substrate 10 is heating up to 140~300° C., the first conductive elements 70 will not become soft (because the melting temperature of the copper is about 1,083° C.), in this manner, it is hard enough for said first conductive elements 70 to be electrically connected to a conductive wire directly (refer to FIG. 2), then it is not necessary for the substrate 10 to be comprised of a conductive element (see the "7" in FIG. 17), and then cost is saved, moreover, the restriction of designing said substrate 10 is also decreased, and the reliability of said substrate 10 is enhanced.

FIG. 1B shows a substrate 10 comprising: an insulator 30 having a first upper surface 31, a first lower surface 32 and a side wall 37, wherein the first lower surface 32 of insulator 30 is not substantially flat (i.e. rough); a receiving area 14 is used for accommodating a chip(s), in order that a chip enables to be mounted on said substrate 10; a plurality of first conductive elements 70, each conductive element 70 having a first upper surface 71, a first lower surface 72, a first side edge 73 and an extending portion 75, wherein the extending portion 75 is coupled with the first upper surface 31 of insulator 30, and said extending portion 75 is common unitary with said first conductive element 70 (i.e. both said extending portion 75 and said first conductive element 70 are substantially unitary), meanwhile, the first side edge 73 of first conductive element 70 encapsulated by the insulator 30 and embedded therein, wherein, the first upper, lower surfaces 71,72 of first conductive element 70 protrude and expose the first upper, lower surfaces 31, 32 of insulator 30 for external connection respectively; Accordingly, due to the first conductive element 70 having an extending portion 75, then (i.) the surface of said first conductive element 70 contacted with the insulator 30 is increased (due to not only the first side edge 73 is encapsulated by the insulator 30 but the extending portion 75 is also coupled with said insulator 30), in this manner, said first conductive element 70 enables to be coupled with said insulator 30 more securely, and then the reliability of said substrate 10 can be enhanced; and (ii.) said extending portion 75 enables to be extending upon the first upper surface 31 of said insulator 30, then the restriction of designing said substrate 10 is decreased, it is good for the industry; In addition, the other more advantages of said extending portion 75 will be explained in FIG. 3.

Figure 6:
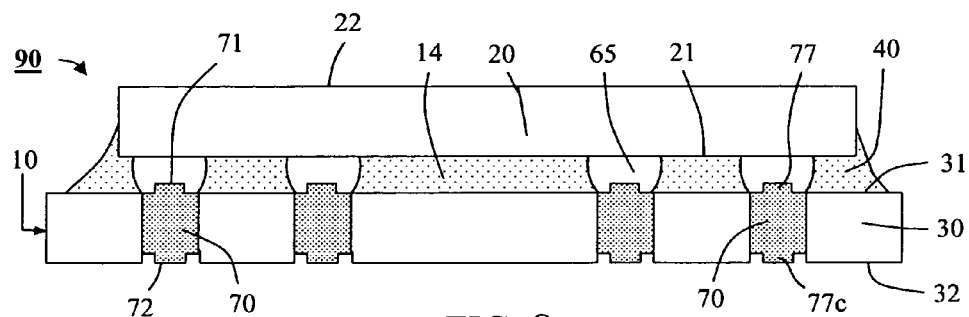

FIG. 1C shows a substrate 10 comprising: an insulator 30 having a first upper surface 31, a first lower surface 32 and a through hole 15 which is serving as a receiving area of said substrate 10 for accommodating chip(s) therein; a plurality of first conductive elements 70, each first conductive element including a protruding portion 77 having an upper surface which is employ as the first upper surface 71 of said first conductive element 70, a first lower surface 72 and a first side edge 73; a plurality of second conductive elements 70a including a first upper surface 71a of said second conductive element 70a, a first lower surface 72a and a first side edge 73a, wherein each first, second conductive element 70,70a encapsulated by the insulator 30 and embedded therein, and each first upper, lower surface 71/71a,72/72a of said first, second conductive elements 70, 70a exposed to the first upper, lower surface 31, 32 of insulator 30 respectively, wherein the first upper surface 71 of first conductive element 70 is not protruded but exposed to the first upper surface 31 of insulator 30, meanwhile the first upper surface 71a of second conductive element 70a is below and exposed to the first upper surface 31 of insulator 30 wherein because said first conductive element 70 consists of the protruding portion 77, then (i.) the surface of said substrate 10 contacted with the encapsulant (see "40" in FIG. 2) is increased, then said substrate 10 enables to be encapsulated by the encapsulant more securely, in this manner, the reliability of electrical device can be enhanced (refer to the detailed description in FIG. 2); and (ii.) the surface of said first conductive element 70 contacted with a conductive bump of chip (see "65" in FIG. 6) is increased, then said first conductive element 70 enables to be electrically connected to the conductive bump (65) firmly (refer to the detailed description in FIG. 6).

FIG. 1D shows a substrate 10, wherein the insulator 30 consists of a first insulator 30a and a second insulator 30b; a plurality of first conductive elements 70 are predetermined shape, wherein both the extending portion 75 and the first side edge 73 of first conductive element 70 are encapsulated by the insulator 30 and embedded therein; moreover, the submember 80 such as a heat spreader encapsulated by the insulator 30 and embedded therein too, the first upper surface 81 of submember 80 exposed to the first upper surface 31 of insulator 30, wherein said first upper surface 81 of submember 80 serving as the receiving area (14) of said substrate 10 which is used for situating a chip; accordingly, due to the extending portion 75 of first conductive element 70 also embedded in the insulator 30, then said first conductive element 70 enables to be encapsulated by said insulator 30 more securely, meanwhile said extending portion 75 of first conductive element 70 still enables to be extending freely, and the first upper surface 71 of first conductive element 70 still also exposed to the insulator 30.

FIG. 1E shows a substrate 10, wherein the first upper surface 71 of the first conductive element 70 protruded and exposed to the first upper surface 31 of insulator 30 for electrical connection; the submember 80 having a through hole 88, a first side edge 83 and a second side edge 84, said through hole 88 serving as the receiving area of said substrate 10 which is used for accommodating a chip, said first side edge 83 of submember 80 encapsulated by the insulator 30, however said second side edge 84 exposed to said through hole 88 of the submember 80, wherein the first upper surface 81 of the submember 80 also protruded and exposed to the insulator 30; in addition, the first lower surface 72 of the first conductive element 70 may be protruded and exposed to the first lower surface 32 of the insulator 30 for external connection as required, and said submember 80 may be employed as a heat spreader; accordingly, due to the through hole 88, a chip (not shown) enables to be placed therein, then the electrical device (not shown) thickness will become thinner.

Figure 7:
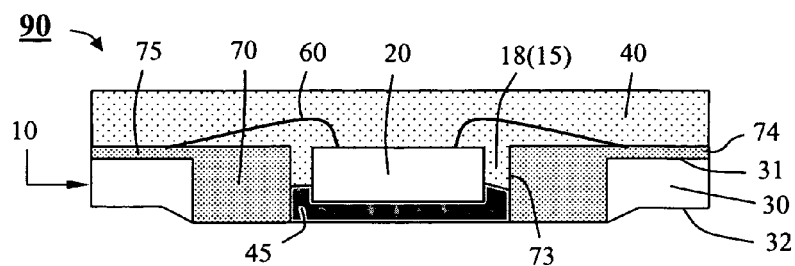

FIG. 1F shows a substrate 10, wherein the first side edge 73 of the first conductive element 70, the first side edge 73a of the second conductive element 70a and the first side edge 83 of the submember 80 are all embedded in the insulator 30, said first, second conductive elements 70, 70a and said submember 80 are predetermined shape, wherein the second conductive element 70a having a plurality of protruding portions 77a, 77b which are opposite to each other; furthermore a chip (not shown) enables to be mounted on the first upper surface 81 of submember 80, wherein due to said submember 80 such as a heat spreader embedded in the insulator 30, in this manner, the heat dissipation of chip will be transferred to the atmosphere more efficiently;

FIG. 1G shows a substrate 10 comprising: an insulator 30 having a first upper surface 31, a first lower surface 32; a through hole 18 serving as a receiving area of the substrate 10 is for accommodating chip(s); a plurality of first conductive elements 70 which are all embedded in the insulator 30, the first upper surface 71 and the first lower surface 72 of first conductive element 70 exposed to the insulator 30 for electrical connection respectively, wherein said first conductive element 70 surrounding the through hole 18 of said substrate 10, and the first side edge 73 of first conductive element 70 encapsulated by the insulator 30, nevertheless, the second side edge 74 of said first conductive element 70 exposed to the through hole 18 of said substrate 10, in this manner, the distance between the first conductive element 70 and the chip (not shown) which is placed in the through hole 18 of said substrate 10 enables to be shortened, and then the heat dissipation of chip can be enhanced (refer to the detailed description in FIG. 7).

FIG. 1H shows a substrate 10, wherein the submember 80 serving as a heat spreader attached onto the first lower surface 32 of the insulator 30, said submember 80 having a plurality of openings 88 in order that each first lower surface 72 of first conductive element 70 still exposed to the first lower surface 32 of insulator 30, wherein said submember 80 may be made of metallic material in order to enhance the heat dissipation of said substrate 10; moreover, the first lower surface 82 of submember 80 may be covered with an insulator layer such as a solder mask (not shown) for protecting said submember 80.

FIG. 1I shows a substrate 10, wherein the insulator 30 having a recessed portion 36, then a second lower surface 34 of insulator 30 is formed; a submember 80 placed in the recessed portion 36, wherein the first upper surface 81 associated with the first side edge 83 of submember 80 coupled with the insulator 30 respectively, nevertheless, the first lower surface 82 associated with the second side edge 84 of submember 80 exposed to the insulator 30; accordingly, due to the submember 80 placed in the recessed portion 36 of insulator 30, in this manner, not only the heat dissipation of said substrate 10 is enhanced, but the thickness of said substrate 10 is also thinner.

FIG. 1J shows a substrate 10 comprising an insulator 30 having a first upper surface 31, a first lower surface 32 and a plurality of openings 38; a receiving area 14 is for accommodating chip; a plurality of first conductive elements 70, wherein each extending portion 75 of the first conductive element 70 being coupled with the first upper surface 31 of insulator 30, and each said first conductive element 70 placed within each corresponding opening 38 of the insulator 30, however each first side edge 73 of said first conductive element 70 is not coupled with the insulator 30; Consequently, although the first side edge 73 of said first conductive element 70 is not coupled with the insulator 30 firstly, nevertheless, a solder paste 62 can be filled into the opening 38 of the insulator 30 in order that the first side edge 73 of said first conductive element 70 enables to be coupled with the insulator 30 through said solder paste 62, while manufacturing an electrical device in accordance with the present invention; accordingly, due to the solder paste 62, the first conductive element 70 enables to be held within the opening 38 of the insulator 30 firmly, moreover, due to one of the areas of said first conductive element 70 for electrical connection becomes larger (i.e. the first lower surface 72 of the first conductive element 70 associated with the surface of the solder paste 62), in this manner, not only it is more convenient for said first conductive element 70 to be electrically connected to the outside, but it is also more secure for said first conductive element 70 to be electrically connected to the outside, and then the reliability of the substrate 10 is enhanced; in addition, the first lower surface 72 of the first conductive element 70 may also be covered with the solder paste 62, meanwhile a portion of the solder paste 62 may be protruded and exposed to the first lower surface 32 the insulator 30 as required; in addition, a plurality of second conductive elements may be embedded in the insulator 30 (refer to FIG. 1N) as required.

Second Embodiment

The second embodiment of present invention will be explained with reference to FIG. 1K~FIG. 1O, wherein the substrate herein consists of an insulator and two conductive layers which are formed by a plurality of first conductive elements and a plurality of second conductive elements respectively; the first conductive elements are electrically connected to the second conductive elements by a plurality of via and/or conductor respectively, meanwhile, the substrate herein may also be formed by the first embodiment of substrate of the present invention combined with the second conductive elements, moreover, the substrate herein may further include a submember as required; detailed descriptions as follow:

FIG. 1K shows a substrate 11 comprising: an insulator 30 having a first upper surface 31, a first lower surface 32; a submember 80 such as a heat spreader having a first upper surface 81, a first lower surface 82 and an extending portion 85; a plurality of first conductive elements 70, second conductive elements 70a, third conductive elements 70b/70b1 and a receiving area 14; wherein each first side edge 73 of first conductive element 70 and the first side edge 83 of the submember 80 encapsulated by the insulator 30 respectively, and said second conductive elements 70a formed on the first surface 31 of the insulator 30, wherein each second element 70a having an opening 78a which is corresponding to each first upper surface 71 of the first conductive element 70, said third conductive elements 70b, 70b1 being formed on the second conductive elements 70a and the submember 80 respectively, wherein a portion of the third conductive element 70b placed in the opening 78a of the second conductive element 70a and coupled with the first upper surface 71 of the first conductive element 70, in this manner, the first conductive element 70 enables to be electrically connected to the second conductive element 70a through the third conductive element 70b; accordingly, the substrate 11 becomes a (two-layer) substrate in which two conductive layers involved therein, and then said substrate 11 will be more useful in the industry.

FIG. 1L shows a substrate 11 formed by a substrate 10 which is one of the first embodiments of the present invention associated with a plurality of second conductive elements 70a, 70a1, 70a2 basically; said substrate 11 comprising: an insulator 30 consists of a first insulator 30a, a second insulator 30b and an opening 38, wherein the second insulator 30b is coupled with the first insulator 30a, in this manner, the first conductive elements 70 and the submember 80 encapsulated by both the first insulator 30a and the second insulator 30b respectively; a plurality of second conductive elements 70a, 70a1, 70a2, wherein the second conductive elements 70a formed on either the first lower surface 72 of the first conductive elements 70 or the first lower surface 82 of the submember 80 respectively, however, the (other) second conductive elements 70a1, 70a2 formed on the first upper surface 31 of the insulator 30 respectively, wherein a portion of the second conductive element 70a1 placed in the opening 38 of the insulator 30 and coupled with the first upper surface 71 of the first conductive element 70, in this manner, the first conductive element 70 enables to be electrically connected to the second conductive element 70a1; moreover, said substrate 11 further including a via 69 which is formed by a conventional method, said via 69 electrically connected the second conductive element 70a2 to the first conductive element 70; accordingly, not only the first conductive element enables to be electrically connected to the second conductive element (70a1) directly, but the first conductive element also enables to be electrically connected to the second conductive element (70a2) by means of a conductor (via), in this manner, it is more flexible for the substrate 11 to be used in the industry.

FIG. 1M shows a substrate 11, wherein the insulator 30 having a first upper surface 31, a first lower surface 32, a second lower surface 34 and a plurality of recessed portions 36; a plurality of second conductive elements 70a having a first upper surface 71a, a first lower surface 72a, a first side edge 73a and a second side edge 74a respectively, each said second conductive element 70a placed within each corresponding recessed portion 36 of insulator 30, wherein the first upper surface 71a associated with the first side edge 73a of the second conductive element 70a being coupled with (i.e. encapsulated by) the insulator 30, nevertheless, the first lower surface 72a associated with the second side edge 74a of the second conductive element 70a exposed to the insulator 30; a plurality of third conductive elements 70b having a first upper surface 71b, a first lower surface 72b respectively, wherein said first upper surface 71b of third conductive element 70b formed on both the first lower surface 32 of insulator 30 and the first lower surface 72 of first conductive element 70 in order that the first conductive element 70 enables to be electrically connected to the second conductive element 70a through the third conductive element 70b; accordingly, said substrate 11 is a two-layer substrate, moreover, due to the recessed portion 36, it allows the substrate 11 to electrically connect to the outside (e.g. mother board or printed circuit board) firmly; in addition the third conductive element 70b may be formed by electrical plating, sputtering or the like.

FIG. 1N shows (basically, the structure of substrate 11 shown in FIG. 1N is similar to the structure of substrate 10 shown in FIG. 1J), the difference is that said FIG. 1N shows the substrate 11 further including a plurality of second conductive elements 70a, 70a1 which are encapsulated by the insulator 30 respectively, wherein the second side edge 74a of the second conductive element 70a exposed to the opening 38 of insulator 30, and the first lower surface 72a of the second conductive element 70a exposed to the first lower surface 32 of insulator 30; furthermore, the solder paste 62 also connects to the second conductive element 70a1, in this manner, the first conductive element 70 enables to electrically connect to the second conductive element 70a1 through the solder paste 62; the first lower surface 72 of the first conductive element 70 may be protruded and exposed to the first lower surface 32 of the insulator 30 and/or the surface of the solder paste 62 as required.

FIG. 1O shows a substrate 11 comprising: an insulator 30 having a cavity 19 serving as the receiving area of said substrate 11 for accommodating a chip etc.; a plurality of first conductive elements 70 which are staircase-shaped respectively, said first conductive element 70 encapsulated by the insulator 30 and embedded therein, said first conductive element 70 extending from the first upper surface 31 of insulator 30 to the cavity 19 with its first upper surface 71 exposed to the insulator 30 for electrical connection; a plurality of second conductive element 70a encapsulated by the insulator 30 and embedded therein too, wherein the first upper surface 71a of second conductive element 70a protrudes and exposes the first lower surface 32 of insulator 30 for electrical connection, the first lower surface 72a of second conductive element 70a embedded in the insulator 30, and the first upper surface 71a of second conductive element 70a may not protrude the first lower surface 32 of insulator 30 but expose to the first lower surface 32 of insulator 30 as required; a plurality of via 69 electrically connect the first conductive elements 70 to the second conductive elements 70a respectively; accordingly, even though the first conductive element 70 is staircase-shaped (i.e. pre-determined shape), due to both the first conductive element 70 and the second conductive element 70a embedded in the insulator 30, in this manner, the reliability of substrate 11 still enables to be enhanced, wherein the first lower surface 72a of the second conductive elements 70a may also be disposed upon the first lower surface 32 of insulator 30 for electrical connection as required.

Third Embodiment

The third embodiment of substrate of the preset invention will be explained with reference to FIG. 1P and FIG. 1Q, wherein the substrate herein consists of a plurality of insulator and a plurality of conductive layers formed by a plurality of conductive elements respectively, said substrate herein is formed by the first and/or the second embodiment of substrate in accordance with the invention, wherein a plurality of via and/or a plurality of conductor electrically connect each conductive element to the other one respectively, in this manner, the substrate herein is formed to a multi-layer substrate, moreover the substrate herein may also include submember(s) such as heat spreader(s) etc. as required, detail descriptions as follow:

FIG. 1P shows a substrate 12 which is formed by a substrate 10 which is one of the first embodiments of the present invention associated with a substrate 11 which is one of the second embodiments of the present invention, wherein the substrate 11 including a first insulator 30a having a first upper surface 31a, wherein a plurality of first conductive elements 70 embedded in the first insulator 30a, said each first upper, lower surface 71,72 of the first conductive element 70 exposed to the first lower surface 32 of the insulator 30 of the substrate 12 and the first upper surface 31a of the first insulator 30a of the substrate 11 respectively; the substrate 10 including a second insulator 30b which is situated on the first upper surface 31a of the first insulator 30a, a second conductive element 70a embedded in said second insulator 30b, wherein the first upper surface 71a of the second conductive element 70a exposed to the first upper surface 31 of the insulator 30 of the substrate 12, and the first lower surface 72a of said second conductive element 70a electrically connected to the first lower surface 72 of first conductive element 70 through a solder paste 62; according to said preferred embodiment of substrate 12, by means of the solder paste 62, then the substrate 12 enables to be formed by the substrate 10 associated with the substrate 11, and then the substrate 12 is a multi-layer substrate.

FIG. 1Q shows a substrate 12 which is formed by a plurality of the substrates 10, said each substrate 10 is one of the first embodiments of the present invention, and each structure of substrate 10 is substantially the same as each other, said substrates 10 are stacked, wherein said substrates 10 are electrically connected to each other through the solder paste 62, and wherein each submember 80 such as a heat spreader is connected to each other through said solder paste too, in this manner, the heat dissipation of the substrate 12 enables to be enhanced.

The mentioned-above insulator of substrate may be made of glass, ceramics, silicon, adhesive means such as glue, epoxy or the like, meanwhile, by means of plating process, the portion of conductive element which is exposed to the insulator and the portion of submember which is also exposed to the insulator may be plated by a conductive material such as nickel, palladium, silver, gold or the like for enhancing the quality of electrical connection, moreover, both the conductive element and the submember may be formed by predetermined shapes (patterns), furthermore, the side edge of conductive element and the side edge of submember 80 may also be exposed to the side wall 37 of insulator 30 as required.

Figure 2:
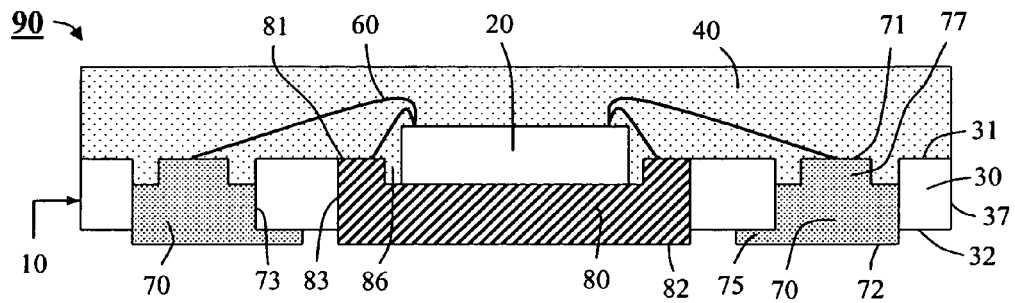
FIGS. 2~10 are cross-sectional views showing embodiments of electrical device according to the present invention, the substrate is used by the first embodiment of substrate.

FIG. 2~10 show embodiments of electrical device in accordance with the present invention, wherein the substrate of electrical device is used by the first preferred embodiment related to this invention, detailed description as follow:

FIG. 2 shows an electrical device 90 comprising: a substrate 10 includes an insulator 30, a plurality of first conductive elements 70, and a submember 80 serving as a heat spreader, wherein said first conductive element 70 and submember 80 are embedded in the insulator 30, said first conductive element 70 having a protruding portion 77 which including an upper surface which is employed as the first upper surface of said first conductive element 70 and a first lower surface 72 which is protruding the first lower surface 32 of insulator 30 for external connection; said submember 80 having a cavity 86, wherein the cavity 86 is serving as the receiving area of substrate 10 for situating chip etc., and the first upper, lower surface 81, 82 of submember 80 exposed to the insulator 30 respectively; a chip 20 placed in the cavity 86 of submember 80; a plurality of conductive means (conductive wires) 60 electrically connected the chip 20 to the first conductive element 70 and the submember 80 respectively; an encapsulant 40 encapsulates the chip 20, conductive means 60 and the substrate 10; accordingly, due to a portion (first lower surface 72) of the first conductive element 70 protrudes and exposes the insulator 30 for electrical connection, in this manner, it is easy for the first conductive element 70 to be electrically connected to outside, then the solder ball is not needed, the cost for manufacturing the electrical device 90 is decreased, Besides, the conductive wire 60 enables to be electrically connected to the first conductive elements 70 directly, then it is not necessary for the substrate 10 to be comprised of a conductive element (see the "7" in FIG. 17), and then the restriction for designing the substrate 10 is decreased; furthermore due to the first conductive element 70 having a protruding portion 77, then the surface of said first conductive element 70 contacted with the encapsulant 40 is increased, in this manner, the substrate 10 enables to be encapsulated by the encapsulant 40 more securely in order to prevent from peeling-off problem, and then the reliability of electrical device 90 enhanced, meanwhile, due to the submember 80 of substrate 10 serving as a heat spreader, the heat dissipation of electrical device 90 enhanced too, in addition, the submember 80 of substrate 10 also serving as a conductive element, and then said submember 80 of substrate 10 enables to electrically connect to outside too, wherein another advantage of the protruding portion 77 of said first conductive element 70 will be explained in FIG. 6.

Figure 3:
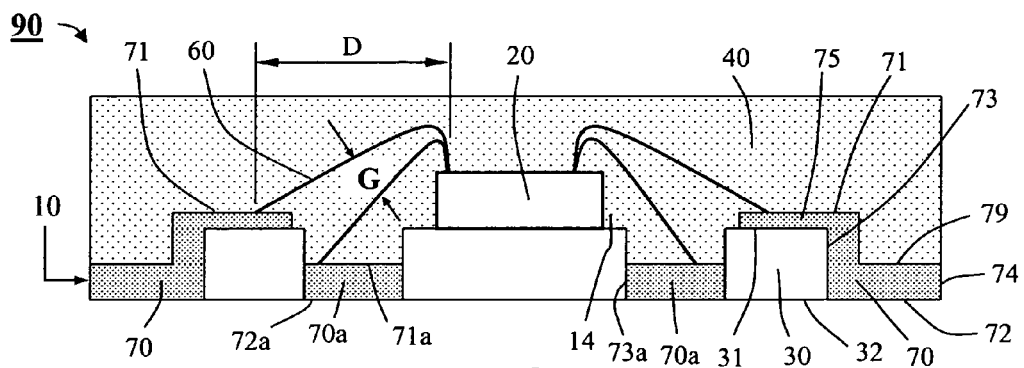

FIG. 3 shows an electrical device 90, wherein both the first conductive elements 70 and the second conductive elements 70a are embedded in the insulator 30, the first upper surface 71 of said first conductive element 70 protrudes and exposes the first upper surface 31 of insulator 30, and the extending portion 75 of said first conductive element 70 situated on the first upper surface 31 of insulator 30 nevertheless, the first upper surface 71a of the second conductive element 70a is not protruded but exposed to the first upper surface 31 of insulator 30, in this manner, the first upper surface 71 and the first upper surface 71a are not in the same horizontal level; a chip 20 mounted on the receiving area 14 of said substrate 10; accordingly, due to the first upper surface 71 of first conductive element 70 and the first upper surface 71a of the second conductive element 70a are not in the same horizontal level, in this manner, the gap "G" between the conductive mean (wire) 60 which is electrically connected to the first conductive element 70 and another conductive mean (wire) 60 which is electrically connected to the second conductive element 70a enables to become wider, in order to prevent said conductive means (wires) 60 from causing short-circuit problem; meanwhile due to the extending portion 75 of first conductive element 70, the first conductive element 70 enables to be getting closer to the receiving area 14 of substrate 10, in this manner, the distance "D" between the chip 20 and the first conductive element 70 enables to be shortened, and then the conductive wire 60 which is electrically connected the chip 20 to the first conductive element 70 enables to be shortened, therefore, the material of conductive wire 60 saved, and the cost of manufacturing the electrical device 90 saved; in addition, the second side edge 74 of the first conductive element 70 exposed to the side wall (37; not shown) of the insulator 30.

Figure 4:
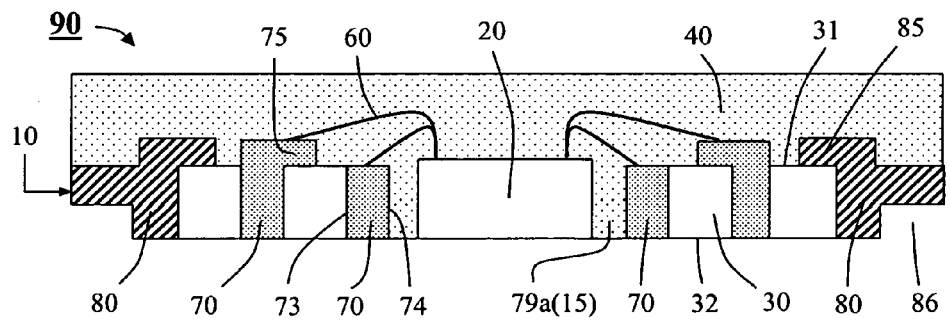

FIG. 4 shows an electrical device 90, wherein the substrate 10 including a submembers 80 such as a heat spreaders, a second conductive element 70a having a through hole 79a which is serving as the receiving area (15) of substrate 10; the chip 20 placed in the through hole 79a of said second conductive element 70a, and said second conductive element 70a surrounding said chip 20, wherein said second conductive element 70 may be serving as a power supply bus (e.g. positive supply bus and/or negative supply bus) in order to be electrically connected to a plurality of conductive wires 60; accordingly, due to the through hole 79a of said second conductive element 70a, the chip 20 enables to be placed therein, then the electrical device 90 thickness is thinner, moreover, due to the submembers 80 embedded in the insulator 30, in this manner, the heat dissipation of the chip 20 will be enhanced.

Figure 5:
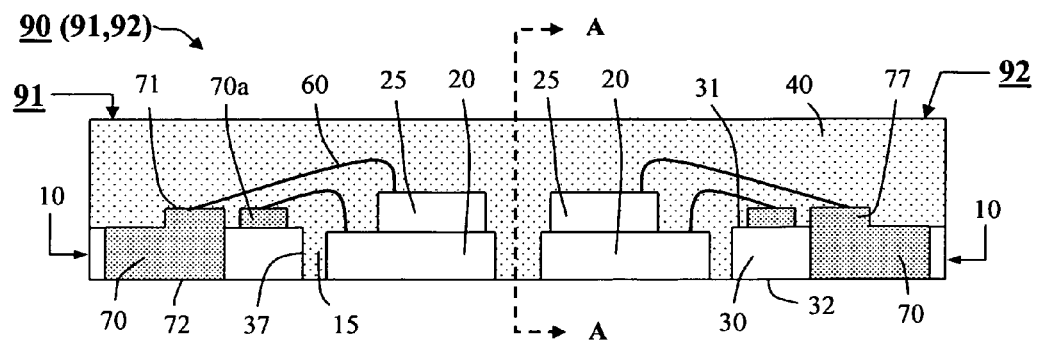

FIG. 5 shows an electrical device 90 which are formed by both the first electrical device 91 and the second electrical device 92, wherein the structure of the first electrical device 91 is substantially the same as the structure of the second electrical device 92, said first electrical devices 91 is corresponding to said second electrical devices 92; accordingly, the electrical device 90 having a through hole 15 which is formed by both the substrate 10 of the first electrical device 91 and the substrate 10 of the second electrical device 92, a plurality of chips 20, 25 placed in said through hole 15, wherein the chip 25 is stacked on the chip 20, in this manner, the electrical device 90 will become more powerful (due to the plural chips 20,25); In addition, the electrical device 90 can be sliced apart after finishing the encapsulation process of encapsulant 40, moreover the first electrical device 91 and the second electrical device 92 are formed, after the electrical device 90 sliced along the "A-A" line, and then the chips 20, 25 will be adjacent to the side wall 37 of substrate 10; and wherein said first electrical device 91 can be employed as a memory card such as Mini-SD Card, the first lower surface 72 of first conductive element 70 is exposed to the first lower surface 32 of insulator 30 and is serving as an interface, in this manner, said first electrical device 91 enables to be inserted into an electrical apparatus such as a digital camera; Consequently, due to the substrate 10, Not only the electrical device 90 enables to be mounted on a mother board (not shown) but the first electrical device 91 also enables to be inserted into an electrical apparatus (not shown), in this manner, It is more flexible for said substrate 10 to be used in the industry.

FIG. 6 shows an electrical device 90, wherein the first conductive element 70 having a plurality of protruding portions 77, 77c which are opposite to each other, wherein said protruding portion 77 of the first conductive element 70 being protruded and exposed to said first upper surface 31 of the insulator 30, however said (another) protruding portion 77c of the first conductive element 70 being not protruded but exposed to the first lower surface 32 of said insulator 30; a chip 20 situated on the receiving area 14 of substrate 10, wherein the active surface 21 of said chip 20 having a plurality of conductive means (bumps) 65, said conductive means (bumps) 65 electrically connected the chip 20 to the first conductive elements 70 of the substrate 10 respectively; an encapsulant 40 encapsulates the chip 20, conductive means 65 and the substrate 10; accordingly, due to the protruding portion 77 of said first conductive element 70, the first conductive element 70 surface contacted with the conductive bump 65 is increased, in this manner, the first conductive element 70 enables to be coupled with the conductive bump 65 more securely, in order to prevent the chip 20 from peeling off the substrate 10, and then the reliability of electrical device 90 enables to be enhanced; furthermore the inactive surface 22 of the chip 20 may also be encapsulated by the encapsulant 40 as required; in addition, the material of insulator 30 may be the same as the material of encapsulant 40 as required, and the chip 20 is employed as a flip chip.

FIG. 7 shows an electrical device 90 comprising: a substrate 10 includes an insulator 30 and a plurality of first conductive element 70, a chip 20 and a through hole 18, said through hole 18 is employed as the receiving area (15) of substrate 10, said first conductive element 70 having an extending portion 75, a first side edge 73 and a second side edge 74, wherein the first side edge 73 of said first conductive element 70 exposed to the through hole 18; a chip 20 is placed and fixed in the through hole 15 by means of an adhesive mean 45 such as glue, epoxy or the like; a plurality of conductive wires 60 electrically connected said chip 20 to said first conductive elements 70 respectively; and an encapsulant 40 encapsulates said chip 20, conductive wires 60, the substrate 10 and the adhesive mean 45; accordingly, due to the second side edge 74 of first conductive element 70 exposed to the through hole 18 of said substrate 10, the first conductive element 70 enables to be getting closer to the chip 20 (i.e. the distance between the first conductive element 70 and the chip 20 enables to be shortened, then the heat dissipation of chip 20 will be enhanced (because the chip 20 generates heat during operating, wherein one of the path of heat dissipation is from chip 20 passing through the conductive wires 60 to the first conductive elements 70, According to the mentioned-above path of heat dissipation, The closer both the conductive element 70 and the chip 20 is, the cooler the chip 20 is). In this manner, the reliability of electrical device 90 enhanced, meanwhile due to the distance between the first conductive element 70 and the chip 20 enables to be shortened, then the length of the conductive wire 60 enables to be shortened too, in this manner, the material of conductive wires 60 is saved, and then cost saved; In addition, said adhesive mean 45 can be serving as a portion of the encapsulant 40, and wherein the material of said adhesive mean 45 can be the same as the encapsulant 40 too.

Figure 8:
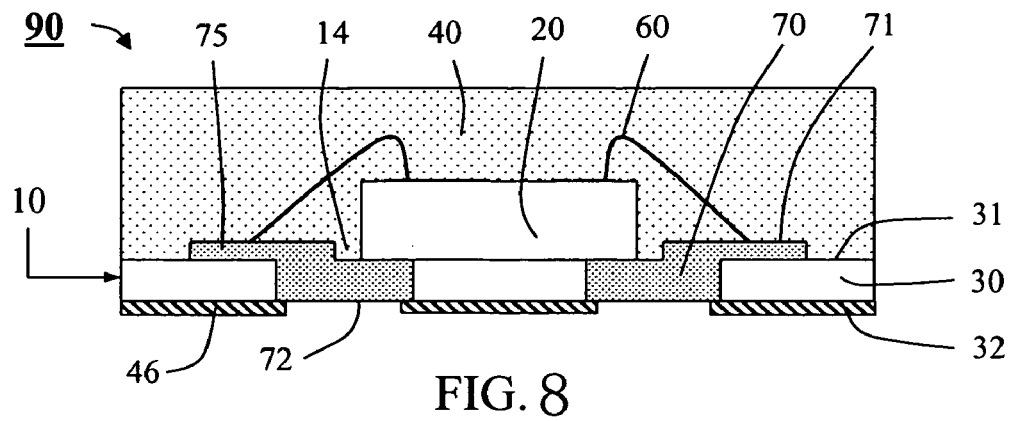

FIG. 8 shows an electrical device 90, wherein, the extending portion 75 of first conductive element 70 disposed on the first upper surface 31 of insulator 30; a chip 20 mounted on the receiving area 14, meanwhile said chip 20 also coupled with the first upper surface 71 of the first conductive element 70, wherein the receiving area 14 also including a portion of first conductive element 70; accordingly, due to a portion of first conductive element 70 involved in the receiving area 14, in this manner, the size of said electrical device 90 enables to be shrunk, and it is good for the industry; in addition, a solder mask 46 attached onto the substrate 10 for protecting said substrate 10.

Figure 9:
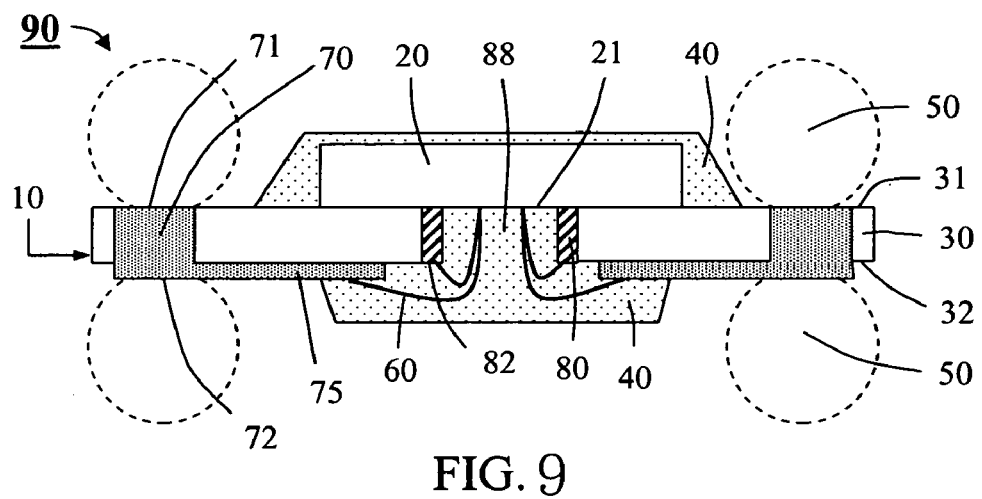

FIG. 9 shows an electrical device 90, wherein the extending portion 75 of first conductive element 70 coupled with the first lower surface 32 of insulator 30, the submember 80 having a through hole 88 serving as an opening of said substrate 10, in this manner, the substrate 10 having an opening (88); a chip 20, wherein the active surface 21 of said chip 20 is coupled with the first upper surface 31 of insulator 30, (i.e. the active surface 21 of said chip 20 is coupled with the surface of substrate 10), meanwhile a portion of active surface 21 of chip 20 exposed to the opening of the substrate 10; a plurality of conductive wires 60 pass through the opening of substrate 10 and electrically connect the chip 20 to either the first conductive elements 70 or the first lower surface 82 of submember 80 respectively; a plurality of encapsulant 40 encapsulate the chip 20, conductive wires 60 and the substrate 10; accordingly, due to both the first upper surface 71 and the first lower surface 72 of first conductive element 70 exposed to the insulator 30 respectively, in this manner, Not only the electrical device 90 enables to be electrically connected to outside by means of the solder ball 50 attached onto both the first upper surface 71 and the first lower surface 72 of first conductive element 70, but the electrical device 90 also enables to be electrically connected to another electrical device (not shown) and stacked thereon, in this manner, said electrical device 90 will become more useful.

Figure 10:
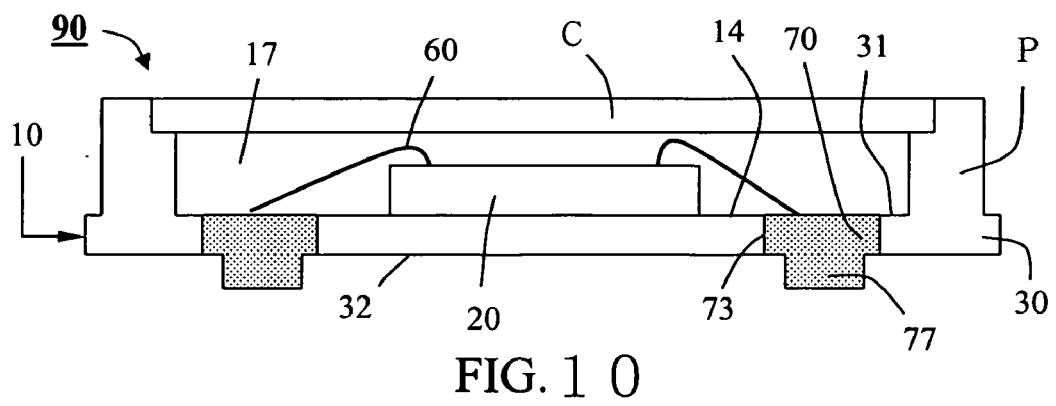

FIG. 10 shows an electrical device 90, wherein the insulator 30 having a protruding portion(s) "P" which is (are) protruding the first upper surface 31 of insulator 30, wherein said protruding portion "P" is close to the periphery of the insulator 30; a chip 20 mounted on the receiving area 14; a plurality of conductive wires 60 electrically connect the chip 20 to the first conductive elements 70 respectively; a lid "C" situated on the protruding portion "P" of insulator 30, in this manner, a sealed area 17 is formed by both the lid "C" and the substrate 10, then the chip 20 and the conductive wires 60 are all hermetically sealed in the sealed area 17, wherein the chip 20 may be employed as an image sensor, optical chip or the like, and the lid "C" may be employed as a transparent plate as required; in addition, an encapsulant (not shown) may be filled into the sealed area 17 for encapsulating the chip 20, conductive wires 60 and the substrate 10, nevertheless the lid "C" may be employed as a heat spreader as required.

Figure 11:
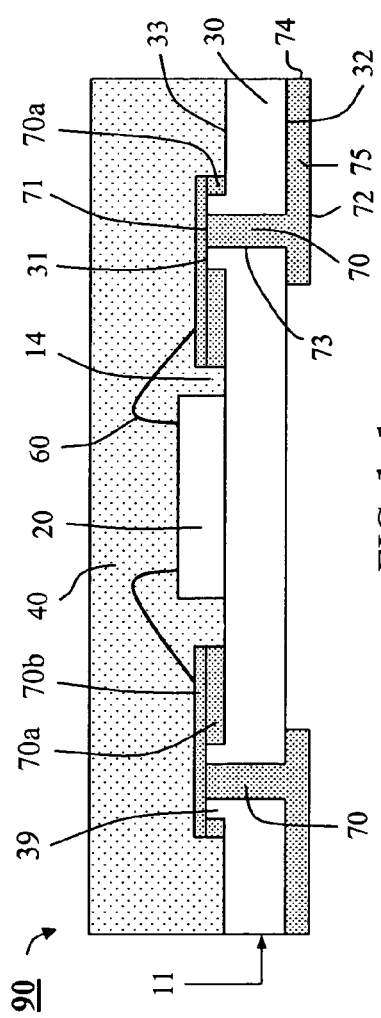
FIG. 11 is a cross-sectional view showing embodiments of electrical device according to the present invention, the substrate is used by the second embodiment of substrate.

FIG. 11 shows an electrical device 90, wherein the substrate 11 is one of the second embodiment of substrate in accordance with the present invention, and the structure of said substrate 11 is similar to the structure of the substrate shown in FIG. 1M, wherein the second conductive element 70a disposed on the second upper surface 33 of insulator 30 and being coupled with the protruding portion 39 of said insulator 30, the third conductive element 70b formed on the first upper surface 31 of insulator 30 and electrically connected the second conductive element 70a to the first conductive element 70; a plurality of conductive wires 60 electrically connected the chip 20 to the second conductive elements 70b respectively, in this manner, the chip 20 enables to be electrically connected to the outside through the first conductive elements 70; accordingly, the second embodiment of substrate of the present invention also enables to be used in the electrical device; wherein the second side edge 74 of the first conductive element 70 is co-planar to the side wall 37 of insulator 30.

Figure 12:
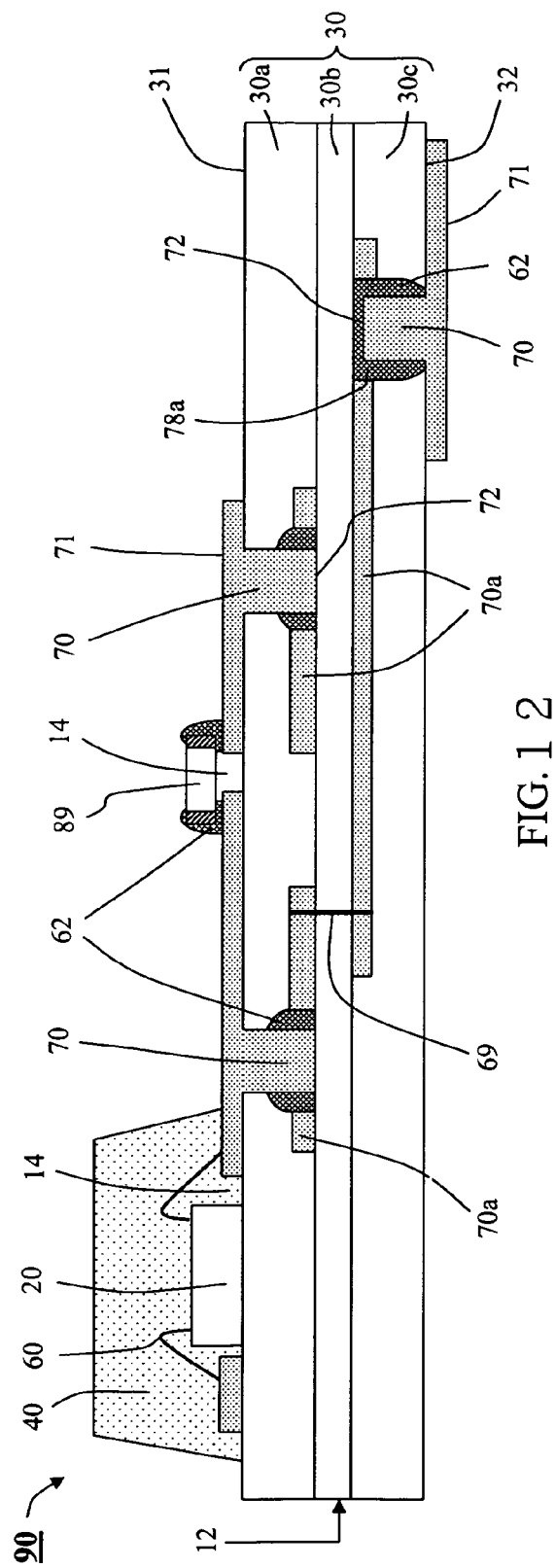
FIG. 12 is a cross-sectional view showing an embodiment of electrical device according to the present invention, the substrate is used by the third embodiment of substrate.

FIG. 12 shows an electrical device 90 serving as a module which is comprised of a substrate 12, chip 20, conductive wires 60, encapsulant 40 and a capacitor 89, wherein the structure of said substrate 12 is employed as one of the structures of the third embodiment of substrate in accordance with the present invention, wherein the first, second conductive elements 70, 70a associated with both the via 69 and the solder paste 62 embedded in the first, second, third insulators 30a, 30b, 30c of insulator 30 respectively, said first, second conductive elements 70, 70a are electrically connected to each other by means of the via 69 and/or the solder pastes 62 which are filled into the openings 78a of the second conductive elements 70a respectively; the chip 20 and the capacitor 89 are mounted on the plural receiving areas 14 of said substrate 12 respectively, wherein the capacitor 89 being electrically connected to the first conductive elements 70 of substrate 12 through the solder pastes 62 and mounted thereon; consequently, although the first lower surface 72 of the first conductive element 70 associated with the second conductive element 70a being not exposed to either the first upper surface 31 or the first lower surface 32 of the insulator 30, but the substrate 12 still enables to be electrically connected to the outside by means of the first upper surfaces 71 of the first conductive element 70 which are protruded and exposed to the first upper, lower surface 31,32 of the insulator 30 respectively; meanwhile the substrate 12 is a four-layer substrate in which the insulator 30 is a three-layer insulator which is comprised of the first insulator 30a, the second insulator 30b and the third insulator 30c, and the four-layer conductive elements embedded therein, and then said substrate 12 will be more useful in the industry; moreover, a resister may be instead of the capacitor 89 as required.

Figure 13:
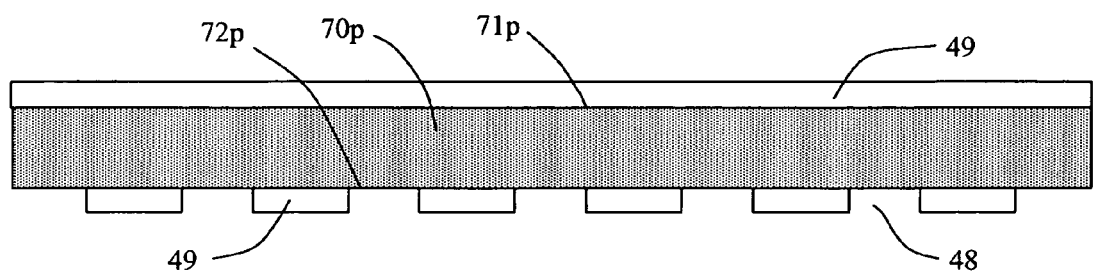
FIGS. 13A~13E show cross-sectional views of a step of a method for manufacturing a first embodiment of substrate of the present invention.
Figure 13:
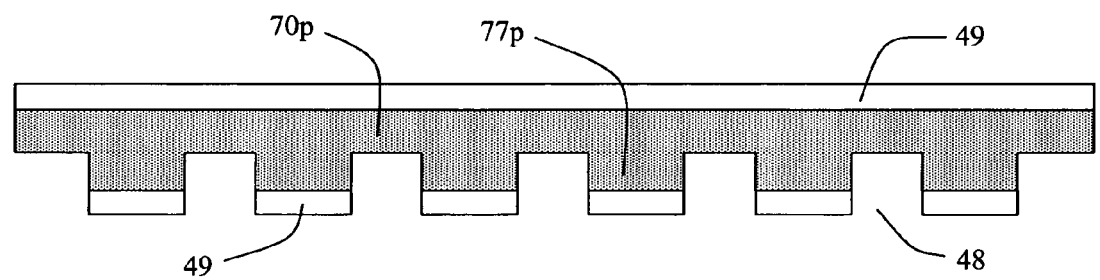
Figure 13:
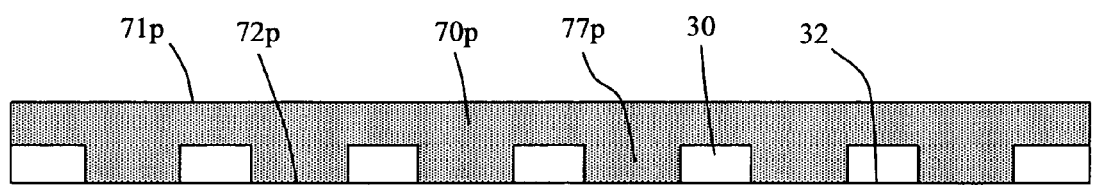

FIG. 13A~13E is a method for manufacturing the first embodiment of substrate of the present invention, detailed descriptions as follow:

FIG. 13A shows Firstly, providing a first conductive plate 70p such as a copper foil having a first upper surface 71p and a first lower surface 72p; Secondly, providing a plurality of dry film 49 which are attached to said first upper surface 71p and said first lower surface 72p of said first conductive plate 70p respectively, and then, by means of photo-resist process, the dry film 49 attached to the first lower surface 72p of first conductive plate 70p forming a plurality of predetermined-shape openings 48, in this manner, a plurality of portions of the first lower surfaces 72p exposed to the openings 48 respectively;

FIG. 13B shows By means of etching process, a plurality of protruding portions 77p formed by the first conductive plate 70p (i.e. said first conductive plate 70p including a plurality of protruding portions 77p), wherein each protruding portion 77p still connects to the first conductive plate 70p respectively, and each protruding portion 77p is adjacent to each other.

Figure 14:
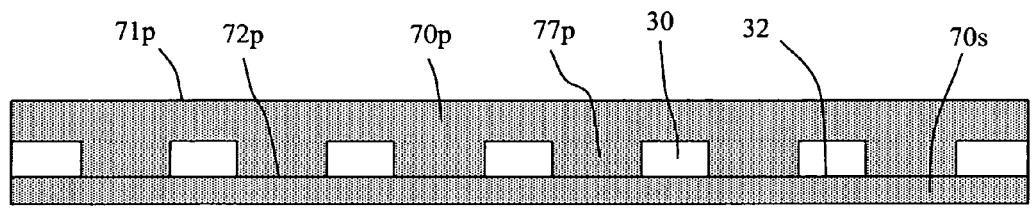
FIGS. 14A~14C show cross-sectional views of a step of a method for manufacturing a second embodiment of substrate of the present invention.
Figure 14:
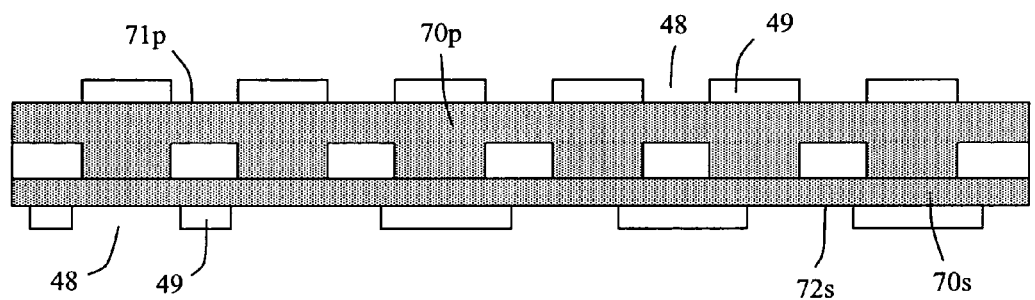
Figure 14:
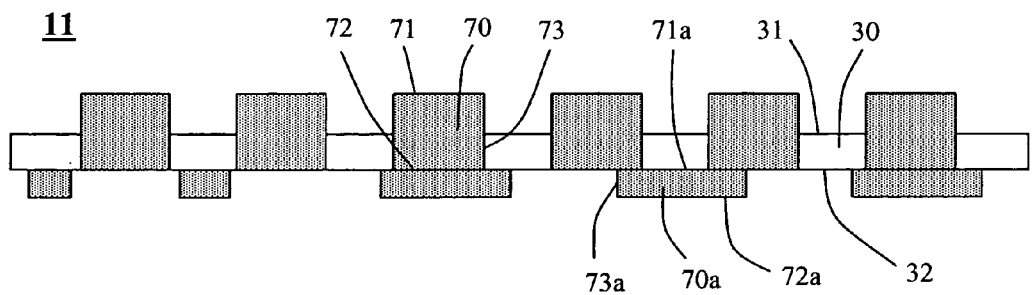

FIG. 13C shows providing a filling process of insulator 30 for encapsulating the first conductive plate 70p associated with the protruding portions 77p after removing the dry films 49 attached on the first conductive plate 70p, and then by means of a solidifying process, the insulator 30 becomes solid, wherein the first lower surface 72p of the first conductive plate 70p being not encapsulated by the insulator 30, but exposed to the first lower surface 32 of the insulator 30; wherein a second conductive plate (see "70s" in FIGS. 14A-

Figure 13D:
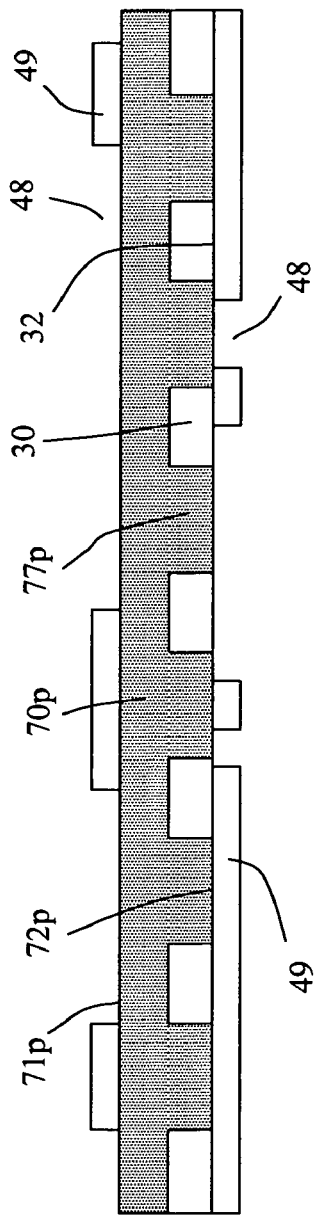
Figure 13E:
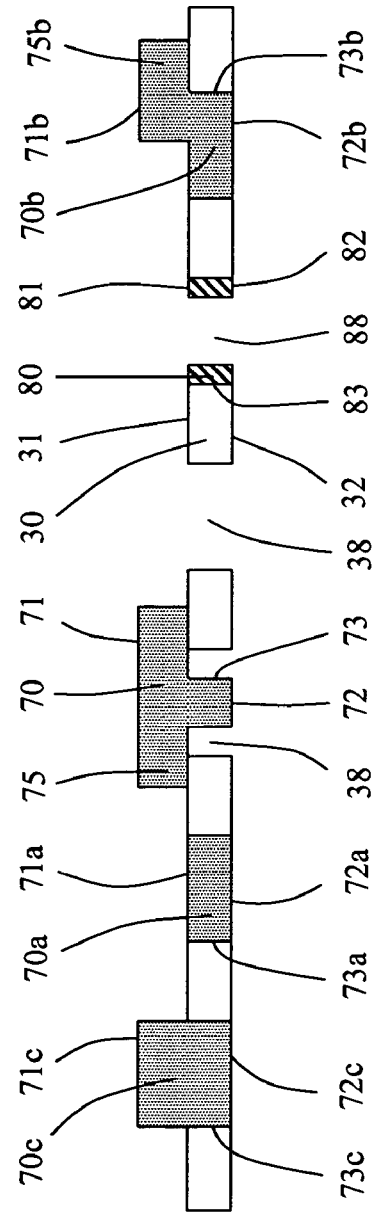

14B) may be coupled with the first lower surface 32 of the insulator 30 the first lower surface 32 as required;

FIG. 13D shows providing dry films 49 for attaching onto the first upper surface 71p of said first conductive plate 70p, the first lower surface 72p of said first conductive plate 70p and the first lower surface 32 of said insulator 30, then, by means of photo-resist process, the dry films 49 having a plurality of openings 48, in this manner, a plurality of portions of the first upper surface 71p and a plurality of portions of the first lower surface 72p exposed to the openings 48 respectively;

FIG. 13E shows after etching process, a plurality of first conductive element 70, second conductive element 70a, third conductive element 70b, fourth conductive element 70c and a submember 80 formed, then removing the dry films 49, and then a substrate 10 is formed, wherein said substrate 10 comprised of an insulator 30 having a first upper surface 31, a first lower surface 32 and a plurality of opening 38; the first conductive element 70 having a first upper surface 71, a first lower surface 72, a first side edge 73 and an extending portion 75, wherein the extending portion 75 of the first conductive element 70 is unitary with the first conductive element 70, said extending portion 75 coupled with the first upper surface 31 of the insulator 30, and the first side edge 73 of the first conductive element 70 placed within one of the openings 38 of the insulator 30, however the first side edge 73 of said first conductive element 70 is not coupled with the insulator 30, said first upper surface 71 of the first conductive element 70 protruded and exposed to the first upper surface 31 of the insulator 30 for external connection, and said first lower surface 72 of the first conductive element 70 exposed to the first lower surface 32 of the insulator 30 for external connection too; the second conductive element 70a having a first upper surface 71a, a first lower surface 72a and a first side edge 73a, wherein the first side edge 73a encapsulated by the insulator 30, and the first upper, lower surfaces 71a, 72a exposed to the first upper, lower surfaces 31, 32 of the insulator 30 for external connection respectively; the third conductive element 70b having a first upper surface 71b, a first lower surface 72b, a first side edge 73b and an extending portion 75b, wherein the extending portion 75b of the third conductive element 70b is unitary with the first conductive element 70, said extending portion 75b coupled with the first upper surface 31 of the insulator 30, and the first side edge 73b encapsulated by the insulator 30, meanwhile said first upper surface 71b of the third conductive element 70 protruded and exposed to the first upper surface 31 of the insulator 30 for external connection, and said first lower surface 72b of the third conductive element 70 exposed to the first lower surface 32 of the insulator 30 for external connection too; the fourth conductive element 70c having a first upper surface 71c, a first lower surface 72c and a first side edge 73c, wherein the first side edge 73c encapsulated by the insulator 30, the first upper surface 71c of the fourth conductive element 70c protruded and exposed to the first upper surface 31 of the insulator 30 for external connection, and said first lower surface 72c of the fourth conductive element 70c exposed to the first lower surface 32 of the insulator 30 for external connection too; and a submember 80 such as a heat spreader which is made of the same material as the first conductive element 70, said submember 80 having a first upper surface 81, a first lower surface 82, a first side edge 83 and a through hole 88, wherein the first side edge 83 encapsulated by the insulator 30, and the first upper, lower surfaces 81, 82 of the submember 80 exposed to the first upper, lower surfaces 31, 32 of the insulator 30 respectively; accordingly, there is a portion of conductive element (e.g. the first upper surface 71c of the fourth conductive element 70c) protruded and exposed to the insulator 30, in this manner, it is convenient for said substrate 10 to be electrically connected to the outside, and then, the solder ball is not needed; furthermore due to each conductive element being made of copper, then each conductive element is Lead-free and Halogen-free, in this manner, the pollution problems of manufacturing said substrate 10 enable to be decreased; Moreover, a plurality of insulating layers such as solder masks or the like may be attached to either the upper surface of the substrate 10 or the lower surface of the substrate 10 for protecting said substrate 10 as required.

FIG. 14A~14C is a method for manufacturing the second embodiment of substrate of the present invention, detailed descriptions as follow:

FIG. 14A shows firstly, providing a first conductive plate 70p associated with a plurality of protruding portions 77p encapsulated by an insulator 30 which is formed by the same process shown in FIG. 13A~13C, secondly, providing a second conductive plate 70s for being coupled with both the first lower surface 32 of the insulator 30 and the first lower surface 72p of the second conductive plate 70s, wherein said second conductive plate 70s may be formed by electrical plating, sputtering or the like;

FIG. 14B shows providing dry films 49 for attaching onto the first upper surface 71p of said first conductive plate 70p and the first lower surface 72s of said second conductive plate 70s, then, by means of photo-resist process, the dry films 49 having a plurality of openings 48, in this manner, a plurality of portions of the first upper surface 71p and a plurality of portions of the first lower surface 72s exposed to the openings 48 respectively;

FIG. 14C shows after etching process, a plurality of first conductive elements 70 and second conductive elements 70a formed, then removing the dry films 49, and then a substrate 11 is formed, wherein said substrate 11 comprised of an insulator 30 having a first upper surface 31 and a first lower surface 32; a plurality of first conductive elements 70, each first conductive element 70 having a first upper surface 71, a first lower surface 72 and a first side edge 73, wherein the first side edge 73 encapsulated by the insulator 30, the first upper surface 71 of the first conductive element 70 protruded and exposed to the first upper surface 31 of the insulator 30 for external connection, and said first lower surface 72 of the first conductive element 70 exposed to the first lower surface 32 of the insulator 30 for external connection too; and a plurality of second conductive elements 70a, each second conductive element 70a having a first upper surface 71a, a first lower surface 72a and a first side edge 73a, wherein the second conductive elements 70a disposed on the lower surface (the first lower surface 32 of the insulator 30 associated with the first lower surface 72 of the first conductive element 70) of the substrate 11 respectively; accordingly, said substrate 11 is a two-layer substrate.

Figure 15A:
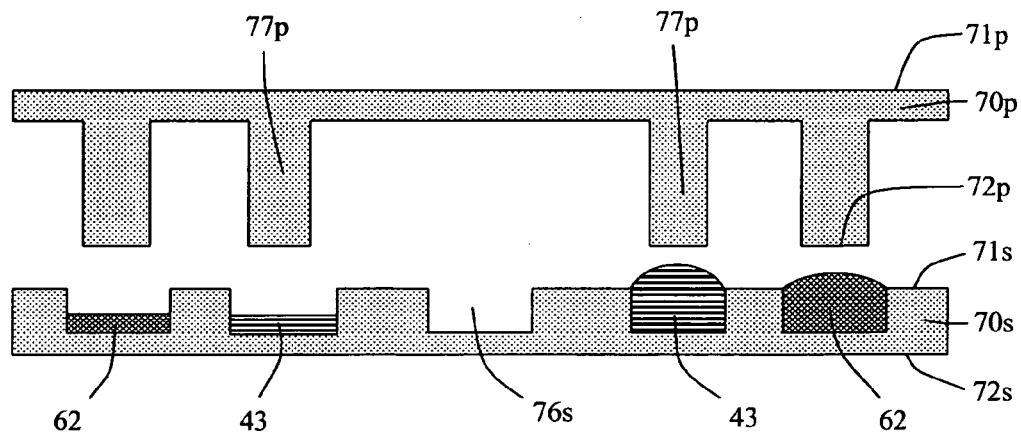
FIG. 15A~15E show cross-sectional views of a step of another method for manufacturing a second embodiment of substrate of the present invention.
Figure 15B:
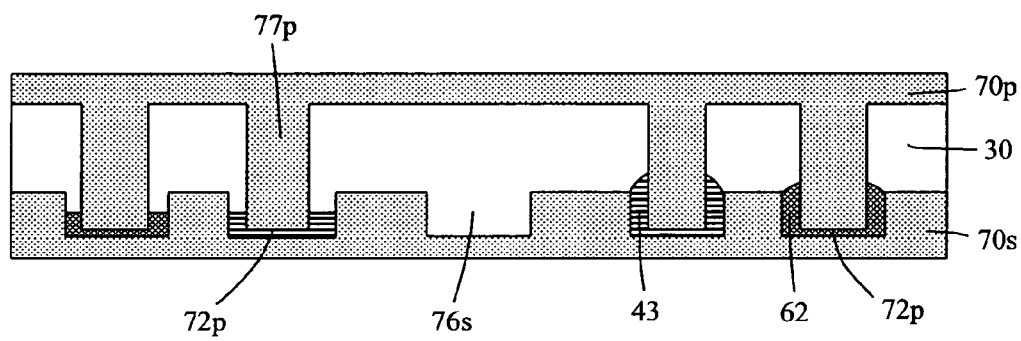
Figure 15C:
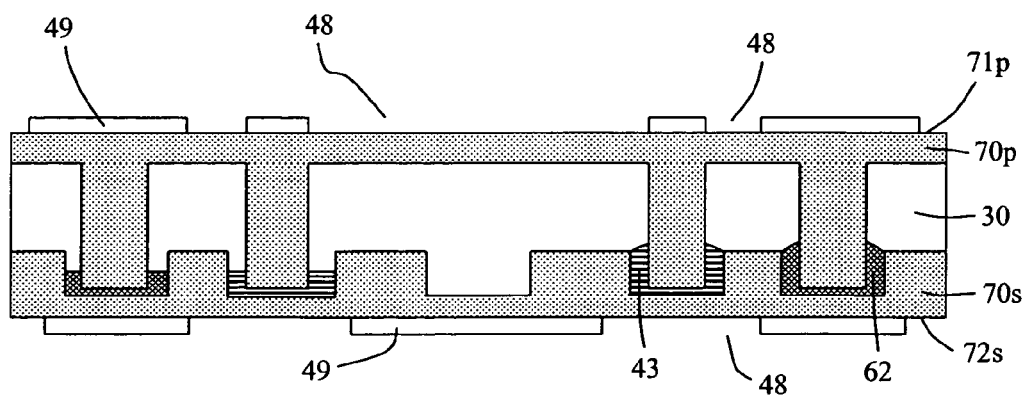
Figure 15:
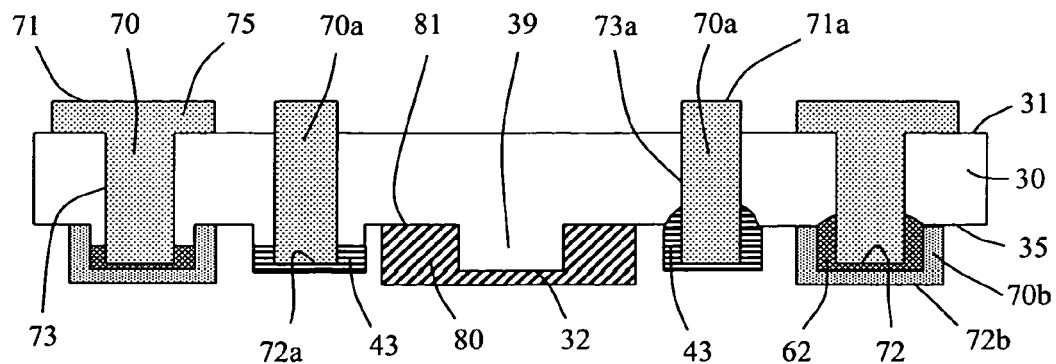
Figure 15:
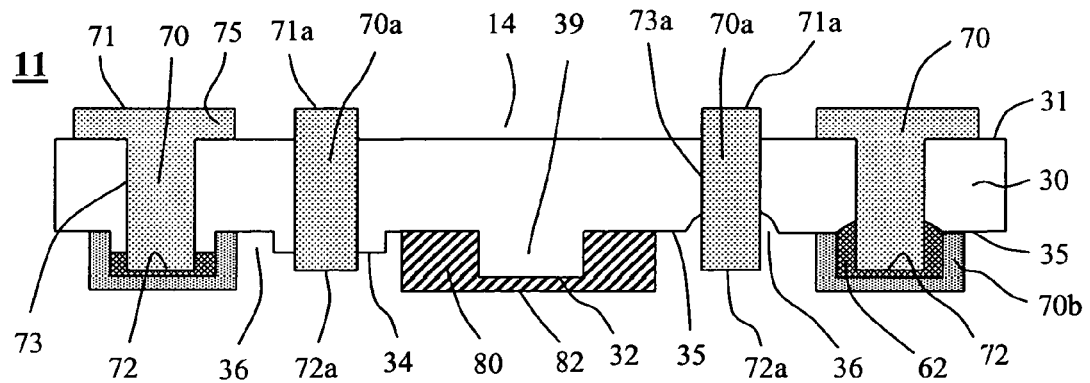

FIG. 15A~15E is another method for manufacturing the second embodiment of substrate of the present invention, detailed descriptions as follow:

FIG. 15A shows firstly, providing a first conductive plate 70p including a first upper surface 71p, a plurality of first lower surfaces 72p and a plurality of protruding portions 77p; secondly, providing a second conductive plate 70s including a first upper surface 71s, a first lower surface 72s and a plurality of recessed portions 76s; thirdly, providing a plurality of solder pastes 62 for filling into two of the recessed portions 76s of the second conductive plate 70s, wherein the solder pastes 62 are not in the same horizontal level; and then providing a plurality of fillers 43 such as soluble insulating material or solder mask for filling into another two of the recessed portions 76s of the second conductive plate 70s, wherein each said filler 43 is not in the same horizontal level either;

FIG. 15B shows both the first conductive plate 70p and the second conductive plate 70s being coupled with each other, wherein a portion of each protruding portion 77p of the first conductive plate 70p being placed within each corresponding recessed portion 76s of the second conductive plate 70s respectively, in this manner, the individual first lower surface 72p of the first conductive plate 70p encapsulated by either the filler 43 or the solder paste 62, then after a solidifying process, the solder pastes 62 and the filler 43 become solid, and then providing a filling process of insulator 30 for filling the insulator 30 into the space between the first conductive plate 70p and the second conductive plate 70s, in this manner, the first conductive plate 70p, the second conductive plate 70s, the filler 43 and the solder paste 62 encapsulated by the insulator 30 respectively;

FIG. 15C shows providing dry films 49 for attaching onto the first upper surface 71p of said first conductive plate 70p and the first lower surface 72s of said second conductive plate 70s, then, by means of photo-resist process, the dry films 49 having a plurality of openings 48, in this manner, a plurality of portions of the first upper surface 71p and a plurality of portions of the first lower surface 72s exposed to the openings 48 respectively;

FIG. 15D shows after etching process, a plurality of first conductive elements 70, second conductive elements 70a formed by the first conductive plate 70p, meanwhile a plurality of third conductive elements 70b and a submember 80 formed by the second conductive plate 70s, then removing the dry films 49, wherein each first lower surface 72a of the second conductive element 70a still encapsulated by the filler 43;

FIG. 15E shows after removing the fillers 43, each first lower surface 72a of the second conductive element 70a being exposed to the insulator 30, and then the substrate 11 formed, said substrate 11 comprising: an insulator 30 including a first upper surface 31, a first lower surface 32, a second lower surface 34, a third lower surface 35, a plurality of recessed portions 36 and a protruding portion 39; a plurality of first conductive elements 70, each first conductive element 70 having a first upper surface 71, a first lower surface 72, a first side edge 73 and an extending portion 75, said first conductive element 70 encapsulated by the insulator 30 and embedded therein, wherein the first upper, lower surfaces 71,72 of the first conductive element 70 protruded and exposed to the insulator 30; a plurality of second conductive elements 70a having a first upper surface 71a, a first lower surface 72a and a first side edge 73a, said second conductive elements 70a encapsulated by the insulator 30 and embedded therein too, wherein the first upper, lower surfaces 71a,72a of the second conductive element 70 protruded and exposed to the first, second, third surfaces 31, 32, 34 of the insulator 30 respectively; a plurality of third conductive elements 70b coupled with both the third lower surface 35 of the insulator 30 and the solder paste 62 respectively, wherein due to the solder paste 62 is between the first conductive element 70 and the third conductive element 70b, then the first lower surface 72 of the first conductive element 70 enables to be electrically connected to the third conductive element 70b through the solder paste 62, and then the third conductive element 70b enables to be electrically connected to the outside; a submember 80 serving as a heat spreader, said submember 80 coupled with both the first lower surface 32 and the third lower surface 35 of the insulator 30 respectively, wherein the first lower surface 82 of the submember 80 protruded and exposed to the third lower surface 35 of the insulator 30.

Figure 16A:
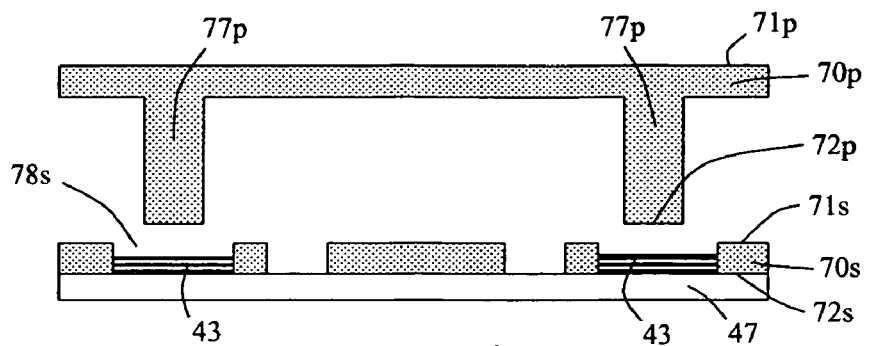
FIG. 16A~16D show cross-sectional views of a step of further another method for manufacturing a second embodiment of substrate of the present invention.
Figure 16B:
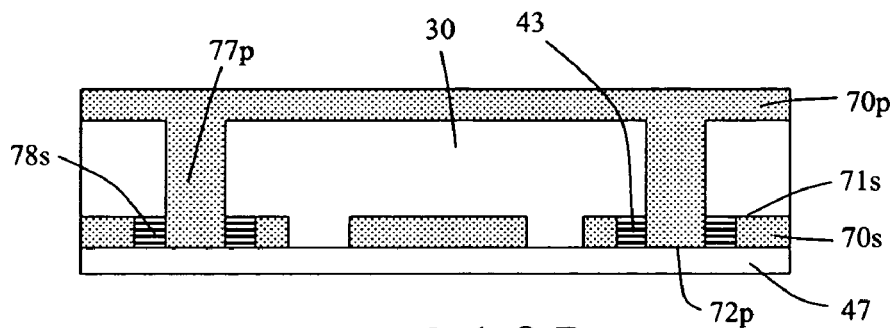
Figure 16C:
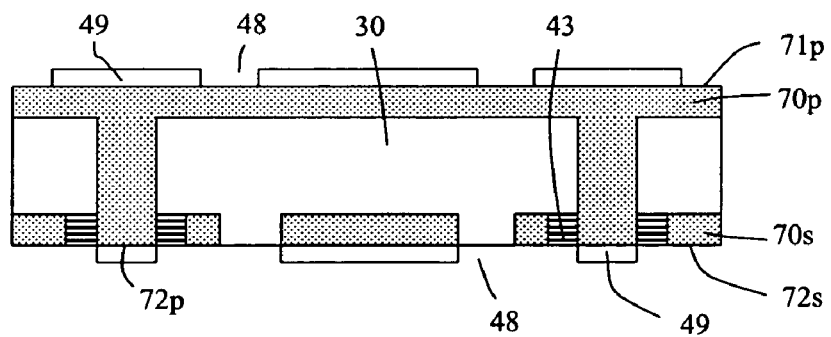
Figure 16D:
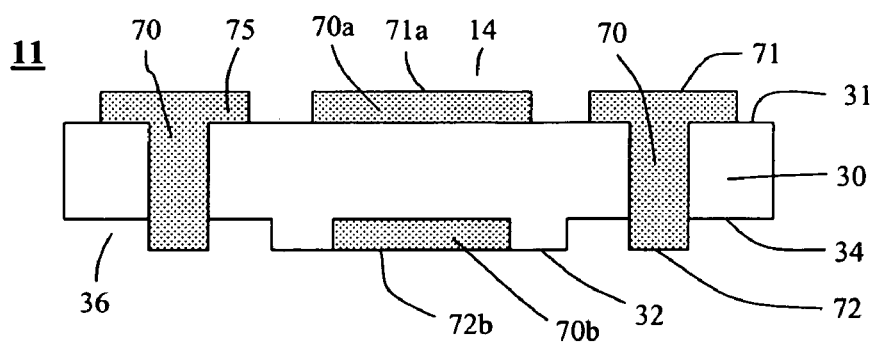

FIG. 16A~16D is further another method for manufacturing the second embodiment of substrate of the present invention, detailed descriptions as follow:

FIG. 16A shows firstly, providing a first conductive plate 70p including a first upper surface 71p, a plurality of first lower surfaces 72p and a plurality of protruding portions 77p; secondly, providing a second conductive plate 70s including a first upper surface 71s, a first lower surface 72s and a plurality of openings 78s, said second conductive plate 70s attaching to an adhesive tape 47, thirdly, filling the filler 43 into the openings 78s of the second conductive element 70s respectively;

FIG. 16B shows both the first conductive plate 70p and the second conductive plate 70s being coupled with each other, wherein a portion of each protruding portion 77p of the first conductive plate 70p being placed within each corresponding opening 78s of the second conductive plate 70s and encapsulated by the filler 43, wherein each first lower surface 72p of the first conductive plate 70p attaching to the adhesive tape 47, then after a solidifying process, the filler 43 becomes solid, and then providing a filling process of insulator 30 for filling the insulator 30 into the space between the first conductive plate 70p and the second conductive plate 70s, in this manner, the first conductive plate 70p, the second conductive plate 70s and the filler 43 encapsulated by the insulator 30 respectively;

FIG. 16C shows providing dry films 49 for attaching onto the first upper surface 71p of said first conductive plate 70p and the first lower surface 72s of said second conductive plate 70s, then, by means of photo-resist process, the dry films 49 having a plurality of openings 48, in this manner, a plurality of portions of the first upper surface 71p and a plurality of portions of the first lower surface 72s exposed to the openings 48 respectively;

FIG. 16D shows after etching process, and removing both the dry films 49 and the filler 43, then a plurality of first conductive elements 70, second conductive elements 70a formed by the first conductive plate 70p, meanwhile a third conductive element 70b formed by the second conductive plate 70s, and then the substrate 11 is formed, said substrate 11 comprising: an insulator 30 including a first upper surface 31, a first lower surface 32, a second lower surface 34 and a plurality of recessed portions 36; a plurality of first conductive elements 70, each first conductive element 70 having a first upper surface 71, a first lower surface 72, a first side edge 73 and an extending portion 75, said first conductive element 70 encapsulated by the insulator 30 and embedded therein, wherein the first upper, lower surfaces 71,72 of the first conductive element 70 protruded and exposed to the insulator 30, respectively; a second conductive element 70a disposed on the first upper surface 31 of the insulator 30, wherein the first upper surface 71a of the second conductive element 70 is employed as the receiving area 14 of the substrate 11 for accommodating chip; a third conductive element 70b embedded in the insulator 30 with its first lower surface 72b exposed to the first lower surface 32 of the insulator 30, wherein the second conductive element 70a is optional, if the third conductive element 70b is omitted, then the substrate 11 will become one of the first embodiments of substrate of the present invention.

In accordance with the foregoing descriptions accompanying drawings, this invention has been described in terms of several preferred embodiments, various alternations and modifications can be made to become apparent to those skilled in the art; For examples: as shown in FIG. 1A, wherein said submember 80 may further include a through hole (refer to "88" in FIG. 1E) as required; as shown in FIG. 1E, wherein the submember 80 of substrate 10 may not only be serving as a heat spreader but also serving as a second conductive element; as shown in FIG. 1I, wherein, after the substrate 10 reversed, then the first lower surface 82 of the submember 80 can be serving as the receiving area of said substrate 10 and a chip can be mounted thereon; as shown in FIG. 1K, wherein the third conductive element 70b and the second conductive element 70a are interchangeable (i.e. said third conductive element 70b is serving as a second conductive element, however said second conductive element 70a is serving as a third conductive element); as shown in FIG. 1N, wherein an insulator may be instead of the solder paste 62; as shown in FIG. 4, wherein the second conductive element 70a may also be serving as a submember; as shown in FIG. 6, wherein a heat spreader (not shown) may be mounted on the inactive surface 22 of said chip 20; as shown in FIG. 13A, wherein said first conductive plate 70p may be made of a metallic alloy or the like; as shown in FIG. 15B, an adhesive layer (not shown) may be between said insulator 30 and said first conductive plate 70p in order to enhance the joining reliability that said insulator 30 encapsulates said first conductive plate 70p, said adhesive layer can be removed by means of etching process, in this manner, the first upper surface 31 of said insulator (see FIG. 15D) enables to be exposed to the atmosphere, wherein the adhesive layer being employed as a portion of said insulator 30; as shown in FIG. 15E, wherein the second lower surface 34 of the insulator 30 and the first lower surface 32 of the insulator 30 are interchangeable (i.e. said second lower surface 34 of the insulator 30 is serving as the first lower surface of said insulator 30, however said first lower surface 32 of the insulator 30 is serving as the second lower surface of said insulator 30); as shown in FIG. 16A, wherein the second conductive plate 70s may be omitted, and then the surface of said adhesive tape 47 having the filler 43 exclusively, in this manner, the substrate 11 shown in FIG. 16D will become one of the first embodiments of substrate of the present invention; meanwhile as shown FIG. 16(A,B,C), wherein the second conductive plate 70s may be employed as second conductive element(s), and the filler 43 may be serving as solder paste; Accordingly, since many such various alterations and/or modifications can be made to the foregoing descriptions, it is to be understood that the scope of the invention is not limited to the disclosed embodiments but is defined by the appended claims.

What is claimed is:

1. A substrate for electrical device, comprising:
   at least a first conductive element having at least a first upper surface, a first lower surface and a first side edge;
   at least an insulator having at least a first upper surface, a first lower surface and a side wall, said first conductive element encapsulated by said insulator and embedded therein, in this manner, said first side edge of said first conductive element being encapsulated by said insulator, said first upper surface of said first conductive element exposed to said first upper surface of said insulator for being plated by at least a conductive material, wherein said first upper surface of said first conductive element being below said first upper surface of said insulator, therefore, at least a recess formed by said first conductive element associated with said insulator, wherein the bottom of said recess formed by said first upper surface of said first conductive element, and wherein said recess being for accommodating at least a conductive material; and
   at least a conductive material, wherein said first upper surface of said conductive element being plated by said conductive material, and wherein at least a portion of said conductive material being placed within said recess, and wherein at least another portion of said conductive material exposed to said first upper surface of said insulator.

2. The substrate of claim 1, further comprising at least another conductive material, wherein said conductive material being plated by said another conductive material and wherein at least a portion of said another conductive material exposed to said first upper surface of said insulator.

3. The substrate of claim 2, further comprising at least a further another conductive material wherein said another conductive material being plated by said further another conductive material, and wherein at least a portion of said further another conductive material exposed to said first upper surface of said insulator.

4. The substrate of claim 1, wherein said insulator further comprising at least a through hole.

5. The substrate of claim 1, wherein said first lower surface of said first conductive element encapsulated by said insulator, in this manner, said first lower surface of said first conductive element being not exposed to said insulator.

6. The substrate of claim 1, wherein said first lower surface of said first conductive element exposed to said first lower surface of said insulator.

* * * * *